United States Patent
Hong et al.

(10) Patent No.: US 8,686,342 B2
(45) Date of Patent: Apr. 1, 2014

(54) DOUBLE-SIDED IMAGE SENSOR FORMED ON A SINGLE SEMICONDUCTOR WAFER DIE

(75) Inventors: Xiao Ying Hong, San Jose, CA (US); Dominic Massetti, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 66 days.

(21) Appl. No.: 13/442,562

(22) Filed: Apr. 9, 2012

(65) Prior Publication Data

US 2013/0264467 A1  Oct. 10, 2013

(51) Int. Cl.
*H01L 27/00* (2006.01)
*H03F 3/08* (2006.01)

(52) U.S. Cl.
USPC .................................. 250/208.1; 250/214 R

(58) Field of Classification Search
USPC ........... 250/208.1, 214 R, 239; 348/300–311; 257/290–292, 440
See application file for complete search history.

(56) References Cited

U.S. PATENT DOCUMENTS

| | | | |
|---|---|---|---|
| 6,150,708 A | 11/2000 | Gardner et al. | |
| 6,927,432 B2 | 8/2005 | Holm et al. | |
| 7,202,140 B1 | 4/2007 | Ang et al. | |
| 7,858,915 B2 * | 12/2010 | McCarten et al. | 250/208.1 |
| 7,915,645 B2 | 3/2011 | Briere | |
| 8,013,342 B2 | 9/2011 | Bernstein et al. | |
| 8,018,031 B2 | 9/2011 | Yanagida | |
| 8,049,256 B2 | 11/2011 | Guidash | |
| 2008/0083939 A1 * | 4/2008 | Guidash | 257/292 |
| 2010/0026865 A1 * | 2/2010 | Tivarus et al. | 348/308 |
| 2010/0148353 A1 | 6/2010 | Kim et al. | |
| 2010/0187557 A1 * | 7/2010 | Samoilov et al. | 257/99 |
| 2010/0224876 A1 | 9/2010 | Zhu | |

* cited by examiner

*Primary Examiner* — Que T Le
*Assistant Examiner* — Carolynn A Moore
(74) *Attorney, Agent, or Firm* — Blakely Sokoloff Taylor & Zafman LLP

(57) ABSTRACT

An example double-sided image sensor includes a semiconductor die, a photodetector, a charge-to-voltage converter, and support circuitry. The semiconductor die has a first side and a second side that is opposite the first side. The photodetector is disposed within the semiconductor die on the first side for accumulating an image charge in response to light incident on the first side. The charge-to-voltage converter is disposed within the semiconductor die on the first side. The transfer gate is also disposed on the first side of the semiconductor die between the photodetector and the charge-to-voltage converter to transfer the image charge from the photodetector to the charge-to-voltage converter. Support circuitry of the image sensor is disposed within the semiconductor die on the second side and is electrically coupled to the charge-to-voltage converter.

30 Claims, 15 Drawing Sheets

US 8,686,342 B2

DOUBLE-SIDED IMAGE SENSOR FORMED ON A SINGLE SEMICONDUCTOR WAFER DIE

TECHNICAL FIELD

This disclosure relates generally to the field of image sensors, and more particularly to active pixel sensors formed on a semiconductor die.

BACKGROUND INFORMATION

To reduce the size of Complementary Metal Oxide Semiconductor (CMOS) image sensors, deeply scaled sub-micron CMOS processes are needed. This creates problems, because as the CMOS processes scale to small dimensions, the details of the process integration and structure change, which generally leads to a degradation of pixel performance. Some examples of this degradation relate to shallow trench isolations, and heavily doped retrograde wells. Both are necessary to build deep sub-micron devices, but have adverse effects on dark current for pixels. As a result, much work has been done to re-integrate and re-optimize the photodetector and pixel into new sub-micron CMOS image sensor designs.

Designers face a trade-off with respect to the design and manufacture of sub-micron CMOS devices. On the one hand, not moving to more scaled CMOS processes maintains pixel image quality, but results in relatively large pixels. On the other hand, moving to more scaled CMOS processes produces smaller pixels, but results in low fill factor for these smaller pixels and degradation of image quality. This creates a need to re-integrate and re-design the photodetector to obtain acceptable image quality.

One solution is to build the photodetector separately from the CMOS circuits. The image sensor, for example, can be built on different wafers, and the wafers joined together using three-dimensional integration or wafer-level interconnect technologies. However, image sensor designs that include two different wafers joined together result in an image sensor that has a relatively thick profile with increased complexity, due to the need for inter-wafer connectors between the stacked wafers.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In short, embodiments of the present invention include a double-sided image sensor that is formed on a single semiconductor wafer, where one side of the wafer includes a photodetector, such as a photodiode, and where an opposite side of the wafer includes support circuitry, such as pixel transistors, control circuitry, readout circuitry, function logic, and the like. Utilizing both sides of a semiconductor wafer, as disclosed herein, allows the designer to use one CMOS process flow for the photodetectors on the top-side of the wafer and a separate CMOS process flow for the support circuitry on bottom-side of the wafer, while also reducing the overall thickness and complexity of the image sensor when compared with the conventional joined wafer solutions described above. Alternatively, the same CMOS process flow may be used for both the top side and the bottom side of the wafer, but with different design rules that allow for different layout complexity. For example, the bottom side that includes support circuitry may use a 65 nm design rule, permitting a relatively more complex layout, whereas the top side that includes a photo-sensing element may use the same process flow but a 110 nm design rule that is appropriate for relatively larger circuit elements.

Figure 1A:
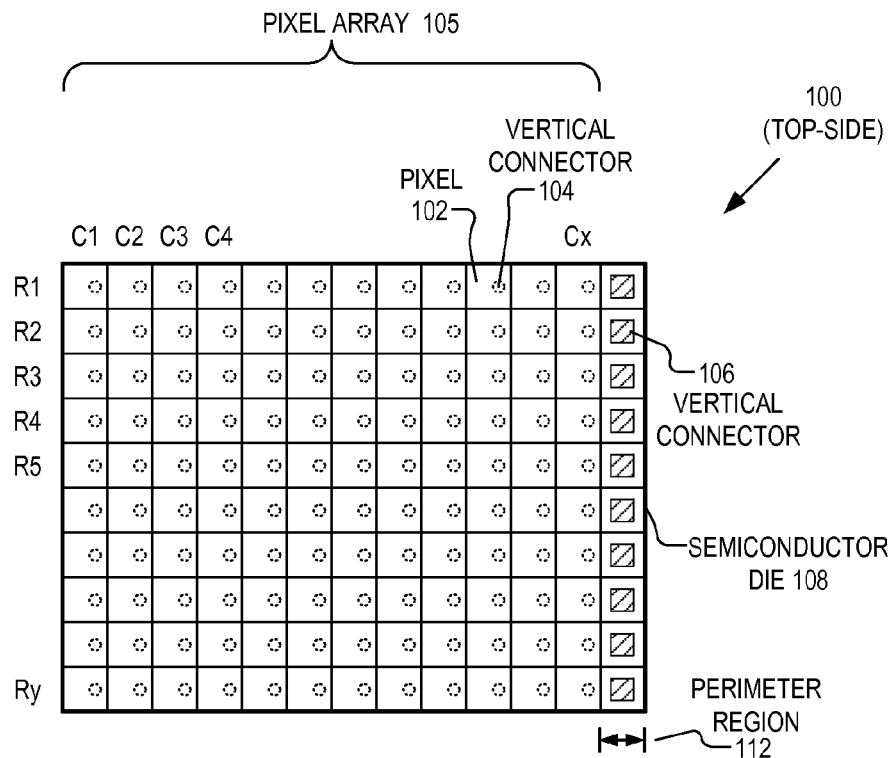
FIG. 1A is a top-side view of an image sensor having a pixel array and vertical connectors in accordance with an embodiment of the invention.

FIG. 1A is a top-side view of an image sensor 100 having a pixel array 105 and vertical connectors 104 and 106, in accordance with an embodiment of the invention. Pixel array 105 is a two-dimensional ("2D") array of pixels (e.g., pixel 102) formed on semiconductor die 108. In one embodiment, image sensor 100 is an active pixel sensor, where, for example, each pixel is a complementary metal-oxide-semiconductor ("CMOS") imaging pixel. An active pixel sensor is so named because each pixel contains one or more active electrical components, or pixel circuitry, such as pixel transistors. As illustrated, each pixel is arranged into a row (e.g., rows R1 to Ry) and a column (e.g., column C1 to Cx) to acquire image data of a person, place, or object, which can then be used to render a 2D image of the person, place, or object.

Image sensor 100 may include any number of pixels. For example, image sensor 100 may include 1280 columns by 960 rows of pixels. Image sensor 100 also includes vertical connectors 104 and 106. Vertical connectors 104 and 106 are for electrically coupling circuitry formed on the top-side of semiconductor die 108 with support circuitry formed the bottom-side of semiconductor die 108. In the illustrated example vertical connectors 106 are formed along at least one edge of image sensor 100 in perimeter region 112. Although FIG. 1A illustrates only one column of vertical connectors 106 formed in perimeter region 112, other embodiments may include vertical connectors 106 on two or more perimeter edges of image sensor 100. Vertical connectors 104 are shown as being disposed within pixel array 105. In one embodiment, each pixel 102 includes a corresponding vertical connector 104 within the pixel (e.g., pixel 102). However, in other embodiments, as will be discussed below with reference to FIGS. 7-10, vertical connectors 104 may be shared between multiple pixels 102.

Although FIG. 1A illustrates image sensor 100 as including a combination of vertical connectors 104 disposed within the pixels 102, along with vertical connectors 106 disposed in perimeter region 112, other embodiments of image sensor 100 may include vertical connectors 104 within pixel array 105 without the inclusion of vertical connectors 106 in perimeter region 112. In yet another embodiment, image sensor 100 may include vertical connectors 106 in perimeter region 112 without the inclusion of vertical connectors 104 within pixel array 105.

Figure 1B:
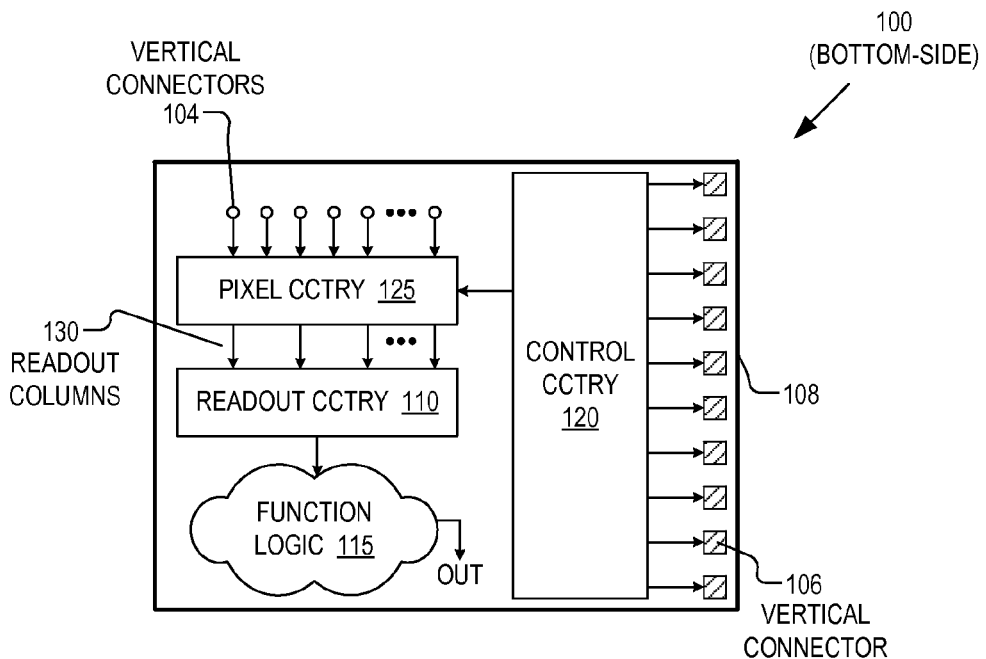
FIG. 1B is a bottom-side view of the image sensor of FIG. 1A.

FIG. 1B is a bottom-side view of image sensor 100 of FIG. 1A. FIG. 1B illustrates image sensor 100 as further including support circuitry disposed on the bottom-side of semiconductor die 108. The illustrated example of FIG. 1B shows support circuitry as including pixel circuitry 125, readout columns 130, readout circuitry 110, function logic 115, and control circuitry 120.

Pixel circuitry 125 is coupled to pixel array 105 on the top-side of semiconductor die 108 by way of vertical connectors 104 and may include active circuit components, such as pixel transistors for operation of the pixel. For example, pixel circuitry 125 may include a source follower (SF) transistor, a reset gate transistor (RG), a row select (RSEL) transistor, and a supply voltage ($V_{DD}$) for each pixel 102.

After each pixel has acquired its image data or image charge, the image data is readout by way of readout columns 130 to readout circuitry 110. Readout circuitry 110 may include amplification circuitry, analog-to-digital ("ADC") conversion circuitry, or otherwise. The image data is then transferred to function logic 115 which may simply store the image data or even manipulate the image data by applying post image effects (e.g., crop, rotate, remove red eye, adjust brightness, adjust contrast, or otherwise). In one embodiment, readout circuitry 110 may readout a row of image data at a time along readout column 130 or may readout the image data using a variety of other techniques (not illustrated), such as a serial readout or a full parallel readout of all pixels simultaneously.

Control circuitry 120 is coupled to pixel array 105 by way of vertical connectors 106 and pixel circuitry 125 to control operational characteristic of pixel array 105. For example, control circuitry 120 may generate a shutter signal for controlling image acquisition. In one embodiment, the shutter signal is a global shutter signal for simultaneously enabling all pixels within pixel array 105 to simultaneously capture their respective image data during a single acquisition window. In an alternative embodiment, the shutter signal is a rolling shutter signal whereby each row, column, or group of pixels is sequentially enabled during consecutive acquisition windows.

Support circuitry located at the bottom-side of image sensor 100 may include additional or different analog and/or digital circuits in other embodiments in accordance with teachings of the present disclosure. Examples of such analog and/or digital circuits include, but are not limited to, row and column decoders and drivers, per column sample and hold circuits, analog signal processing chains, digital imaging processing blocks, memory, timing and control circuits, input/output (I/O), and bonding pads. Examples also include other embodiments of logic circuits that are appropriate for the function of image sensor 100.

Figure 2:
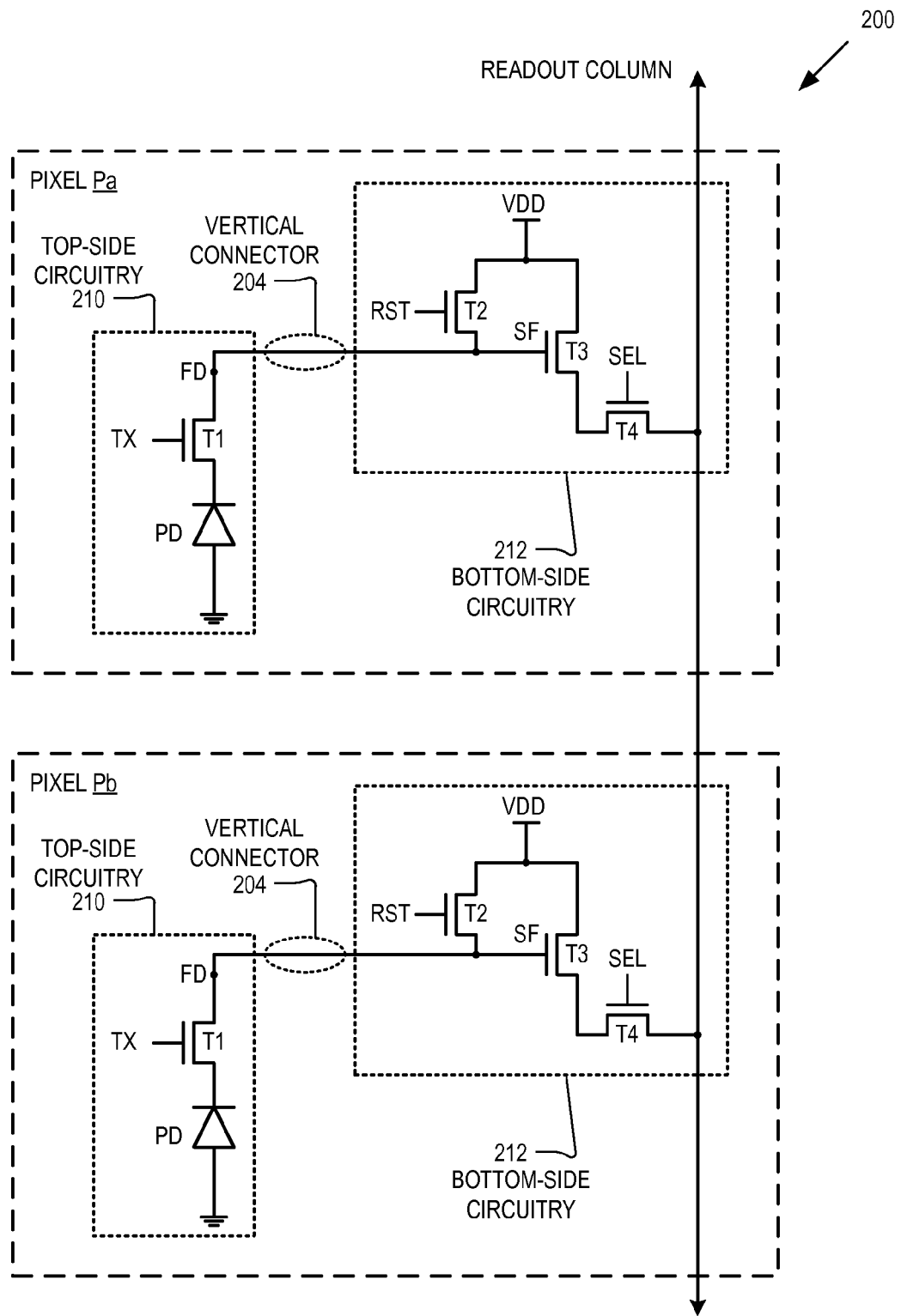
FIG. 2 is a circuit diagram illustrating pixel circuitry of two 4T pixels within an image sensor, in accordance with an embodiment of the invention.

FIG. 2 is a circuit diagram illustrating pixel circuitry 200 of two four-transistor ("4T") pixels within a pixel array, in accordance with an embodiment of the invention. Pixel circuitry 200 is one possible pixel circuitry architecture for implementing each pixel within pixel array 105 of FIGS. 1A and 1B. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 2, pixels Pa and Pb are arranged in two rows and one column. The illustrated embodiment of each pixel in pixel circuitry 200 includes a photodetector (e.g., photodiode PD), a transfer (TX) transistor T1, a reset (RST) transistor T2, a source-follower (SF) transistor T3, a select (SEL) transistor T4, and a charge-to-voltage converter (e.g., floating diffusion node (FD)). As shown in FIG. 2, the photodiode PD, the transfer transistor T1 and the floating diffusion node FD are included in top side circuitry 210 and are thus disposed on a top-side of the semiconductor die, such as die 108 of FIGS. 1A and 1B. The reset transistor T2, source-follower transistor T3, and select transistor T4 are shown as being included in bottom-side circuitry 212 and are thus disposed on a bottom-side of the semiconductor die, such as die 108 of FIGS. 1A and 1B.

During operation, transfer transistor T1 receives a transfer signal TX, which transfers the charge accumulated in photodiode PD to floating diffusion node FD. In one embodiment, floating diffusion node FD may be coupled to a storage capacitor (not shown) for temporarily storing image charges. The floating diffusion FD node is then electrically coupled to the source-follower transistor T3 on the bottom-side of the semiconductor die by way of vertical connector 204. In other words, vertical connector 204 electrically couples top-side circuitry 210 to bottom-side circuitry 212. Vertical connector 204 may be any of the aforementioned vertical connectors, such as vertical connector 104 or vertical connector 106 of FIGS. 1A and 1B.

Reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the floating diffusion FD. Finally, select transistor T4 selectively couples the output of the pixel to the readout column under control of a select signal SEL to select the pixel from other pixels of the image sensor.

In one embodiment, the TX signal, the RST signal, and the SEL signal are generated by control circuitry 120 of FIG. 1B. In an embodiment where pixel array 105 operates with a global shutter, the global shutter signal is coupled to the gate of each transfer transistor T1 in the entire pixel array 105 to simultaneously commence charge transfer from each pixel's photodiode PD. Alternatively, rolling shutter signals may be applied to groups of transfer transistors T1.

Figure 3A:
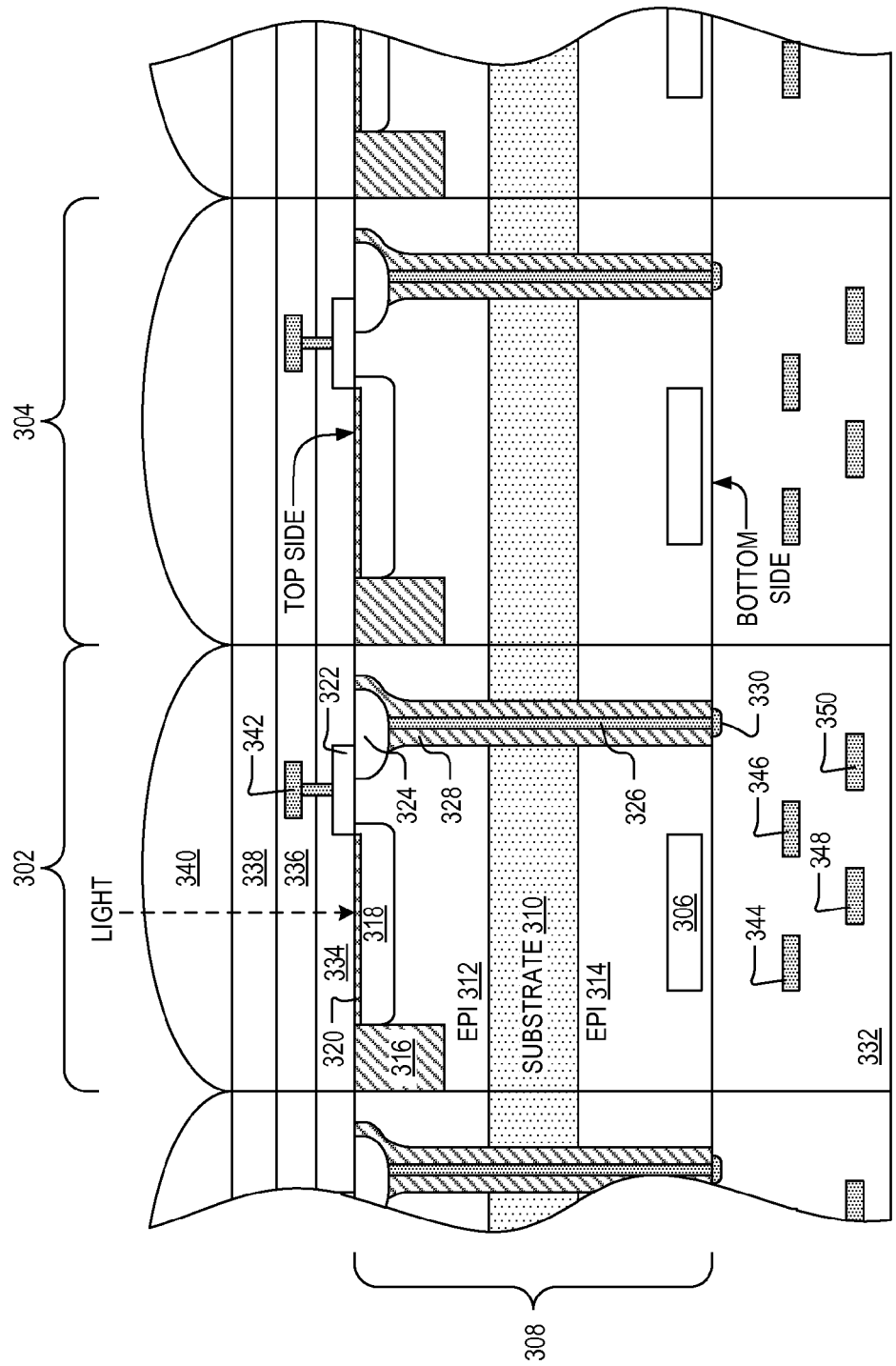
FIG. 3A is a cross sectional view of two pixels of an image sensor having support circuitry disposed on a bottom-side of a semiconductor die, in accordance with an embodiment of the invention.

FIG. 3A is a cross sectional view of two pixels 302 and 304 of an image sensor having support circuitry 306 disposed on a bottom-side of a semiconductor die 308, in accordance with an embodiment of the invention. The illustrated example of pixel 302 includes support circuitry 306, a substrate 310, a top-side epitaxial (EPI) layer 312, a bottom-side epi layer 314, an isolation region 316, a photodetector (e.g., photodiode region 318), a pinning layer 320, a transfer gate 322, a charge-to-voltage converter (e.g., floating diffusion region 324), a vertical connector 326, isolation region 328, node 330, bottom-side interconnect layer 332, dielectric layer 334, top-side interconnect layer 336, color filter 338, and microlens 340. Top-side interconnect layer 336 is shown as including a metal layer 342 and bottom-side interconnect layer 332, is shown as including metal layers 344, 346, 348, and 350. Pixels 302 and 304 are possible implementations of pixels Pa and Pb of FIG. 2, and of pixels 102 within pixel array 105 of FIGS. 1A and 1B.

As shown in the embodiment of FIG. 3A, semiconductor die 308 includes top-side epitaxial (epi) layer 312 disposed on substrate 310 and bottom-side epi layer 314 disposed on a surface of substrate 310 opposite epi layer 312. Thus, top-side epi layer 312 may provide the top-side of semiconductor die 308, while bottom-side epi layer 314 provides the bottom-side of semiconductor die 308. In one embodiment, substrate 310 is a single layer of silicon. By way of example, substrate 310 may a single layer of a wafer sliced from an ingot of silicon, such as crystal silicon. Substrate 310 may then have one or more layers of silicon epitaxially grown on its surface to form epi layer 312 and/or epi layer 314. In one embodiment, epi layers 312 and 314 are P− doped epi layers, while substrate 310 is P+ doped. It is noted that semiconductor die 308 is not necessarily drawn to scale. For example, substrate 310 may have a thickness of about 500 micrometers to 700 micrometers, while epi layers 312 and 314, each may have a thickness of about 10 micrometers. Also, although FIG. 3A shows semiconductor die 308 as including both a top-side epi layer 312 and a bottom-side epi layer 314, other embodiments may include only one or even no epi layers and still benefit from the teachings herein. For example, in one embodiment, semiconductor die 308 does not include bottom-side epi layer 314, and support circuitry 306 is formed directly within the bottom-side of substrate 310.

The illustrated embodiment of pixels 302 and 304 are front-side illuminated (FSI) active pixels. By way of example, photodiode region 318 is disposed within top-side epi layer 312 on the top-side of semiconductor die 308 and accumulates an image charge in response to light incident on the top-side of semiconductor die 308. In one embodiment, photodiode region 318 is implemented as a pinned photodiode by way of pinning layer 320.

Transfer gate 322 is shown as disposed on the top-side of semiconductor die 308 between photodiode region 318 and floating diffusion 324. During operation, transfer gate 322 receives a transfer signal by way of metal layer 342 in top-side interconnect layer 336. Transfer gate 322 then transfers the charge accumulated in photodiode region 318 to floating diffusion region 324. In one embodiment, the image sensor includes a transfer gate driver (not shown) located in a periphery on the top-side of semiconductor die 308 and coupled to the transfer gate 322 by way of metal layer 342 in top-side interconnect layer 336. In another embodiment, the transfer gate driver is included in support circuitry 306 on the bottom-side of semiconductor die 308. In this embodiment, a transfer gate driver included in support circuitry 306 is coupled to metal layer 344 of bottom-side interconnect layer 332, which is coupled to a second vertical connector (not shown), which is then coupled to provide the transfer signal to the transfer gate 322 by way of metal layer 342 of top-side interconnect layer 336. Additional vertical connectors utilized for transmitting additional signals between the top-side and bottom-side of semiconductor die 308, such as the aforementioned transfer signal, may be located in a perimeter region of semiconductor die 308 and will be discussed in more detail below with reference to FIGS. 11 and 12.

As shown in FIG. 3A, pixel 302 includes a vertical connector 326. In one embodiment, vertical connector 326 includes metal that extends from floating diffusion region 324 to node 330 located on the bottom-side of semiconductor die 308. Vertical connector 326 may be implemented as a through silicon via (TSV), in an embodiment in accordance with the invention, and may be laterally surrounded by isolation region 328. Isolation region 328 may be implemented as any non-conductive material, such as, for example, silicon dioxide and may be included to isolate vertical connector 326 from substrate 310 and epi layers 312 and 314.

Vertical connector 326 and bottom-side interconnect layer 332 function to electrically connect floating diffusion region 324, which is situated at the top-side of semiconductor die 308, to support circuitry 306, which is situated at the bottom-side of semiconductor die 308. In one embodiment as shown in FIG. 3A, vertical connector 326 is electrically connected to a node 330 on the bottom-side, which is further electrically connected to bottom-side interconnect layers 332, which is further electrically connected to support circuitry 306 through metal layers, such as 344, 346, 348, and 350. In another embodiment in accordance with the invention, vertical connector 326 may be electrically connected to bottom-side interconnect layers 332 without node 330. For example, vertical connector 326 may be directly connected to a metal layer 344, 346, 348, or 350 of bottom-side interconnect layers 332, which is further electrically connected to support circuitry 306. In yet another embodiment, vertical connector 326 is electrically connected to node 330, which is directly connected to support circuitry 306.

In one embodiment, support circuitry 306 includes bottom-side pixel circuitry, such as bottom-side circuitry 212 of FIG. 2. For example, floating diffusion region 324 may be electrically coupled to a source-follower transistor (e.g., transistor T3 of FIG. 2) by way of vertical connector 326, where the source-follower transistor is located on the bottom-side of the semiconductor die 308 in support circuitry 306. In other words, vertical connector 326 electrically couples pixel circuitry on the top-side of semiconductor die 308 with pixel circuitry on the bottom-side.

Figure 3B:
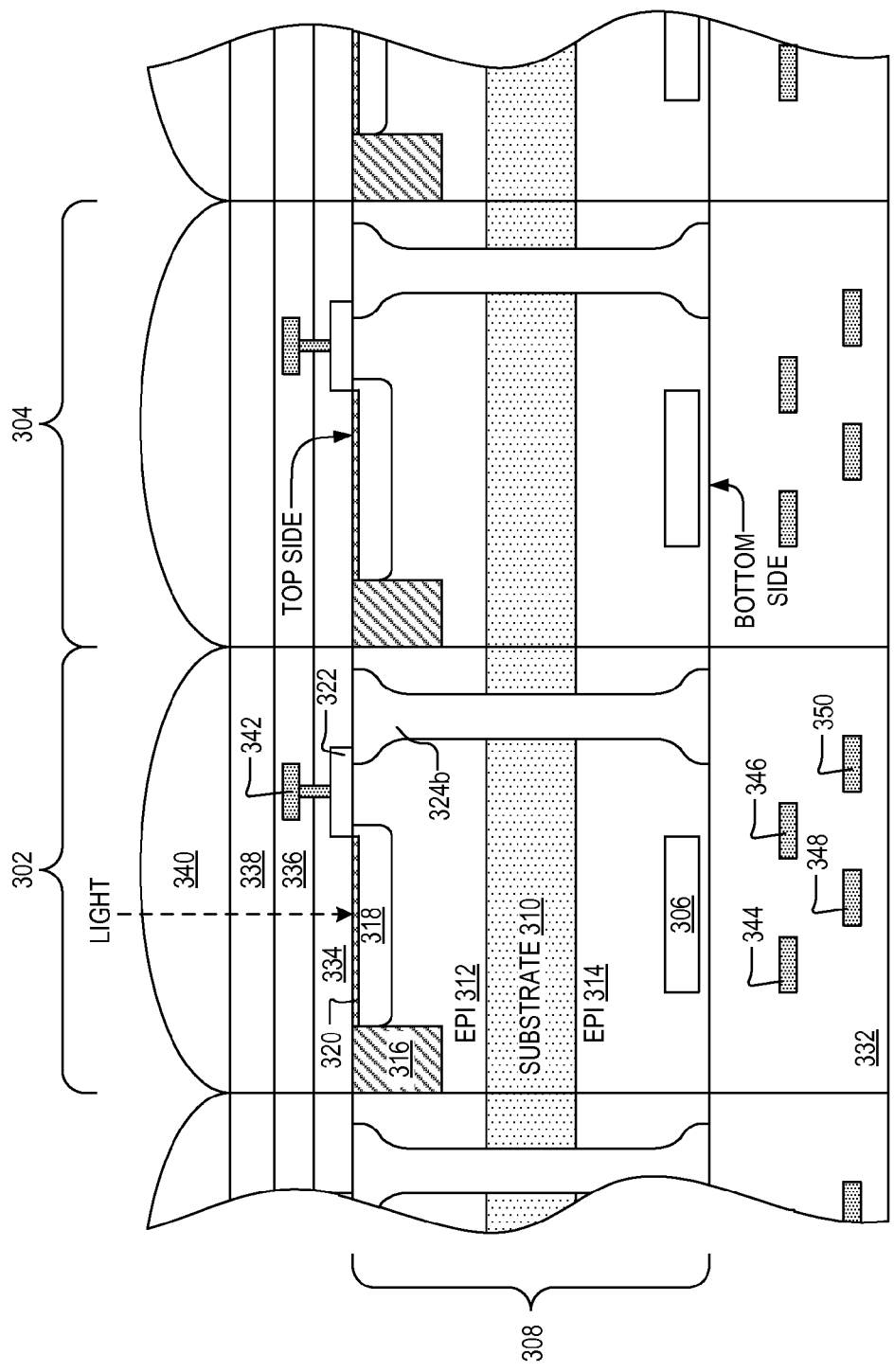
FIG. 3B is a cross sectional view of two pixels of an image sensor having support circuitry disposed on a bottom-side of a semiconductor die, which includes an extended floating diffusion, in accordance with an embodiment of the invention.

An alternative embodiment to floating diffusion 324 and vertical connector 326 is illustrated in FIG. 3B. As shown in this figure, the electrical connection between the top side and the bottom side is achieved with an extended floating diffusion region 324b, which spans through semiconductor die 308. Extended floating diffusion region 324b may be N+, and may additionally be surrounded by a P+ layer (not shown). Extended floating diffusion 324b is connected to transfer gate 322 at the top side, and is electrically coupled to support circuitry 306 at the bottom side. For example, extended floating diffusion 324b may be electrically coupled to a source-follower transistor (e.g., transistor T3 of FIG. 2) directly. Other electrical couplings between extended floating diffusion 324b and support circuitry 306 are similar to examples involving vertical connector 326 disclosed in the preceding paragraphs.

Referring now to both FIGS. 3A and 3B, each pixel 302 and 304, at the bottom-side of semiconductor die 308, may include support circuitry 306. The types of components and circuits included in support circuitry 306 may depend on the purpose or use of image sensor. By way of example, support circuitry 306 may include a source follower (SF) transistor, a reset gate transistor (RG), a row select (RSEL) transistor, and a supply voltage ($V_{DD}$) for the pixel. Support circuitry 306 may also include additional or different analog and/or digital circuits in other embodiments of the invention. Examples of such analog and/or digital circuits include, but are not limited to, row and column decoders and drivers, per column sample and hold circuits, analog signal processing chains, digital imaging processing blocks, memory, timing and control circuits, input/output (I/O), and bonding pads. Examples also include other embodiments of logic circuits that are appropriate for the function of the image sensor.

Accordingly, different CMOS process flows may be used for the top side and the bottom side separately. Alternatively, the same CMOS process flow may be used for both the top side and the bottom side of the wafer, but with different design rules that allow for different layout complexity. For example, the bottom side that includes support circuitry may use a 65 nm design rule, permitting a relatively more complex layout, whereas the top side that includes a photo-sensing element may use the same process flow but a 110 nm design rule that is appropriate for relatively larger circuit elements.

FIGS. 3A and 3B further illustrate pixel 302 as including a color filter 338 disposed on top-side interconnect layer 336. Color filter 338 may be configured to filter the bandwidth of incident light received by each photodiode region 318. By way of example, color filter 338 may be configured such that light propagating at or near the red spectrum (or infrared spectrum) is received by photodiode region 318. In another example, color filter 338 may be configured such that light propagating at or near the green spectrum is received by photodiode region 318. In yet another example, color filter 338 may be configured such that light propagating at or near the blue spectrum is received by photodiode region 318. In one embodiment, color filter 338 may be configured such that light propagating at or near the panchromatic spectrum, spanning the spectra of a multitude of colors, is received by photodiode region 318. A multitude of color filters 338 included in the pixel array (e.g., pixel array 105 of FIG. 1A) combine to form a color filter array. Examples of a color filter array may include red-green-blue (RGB), yellow-cyan-magenta (YCM), or a mix of color filter and panchromatic filter. Microlenses 340 are formed over color filter 338, and are used to focus light towards photodiode region 318.

Figure 4:
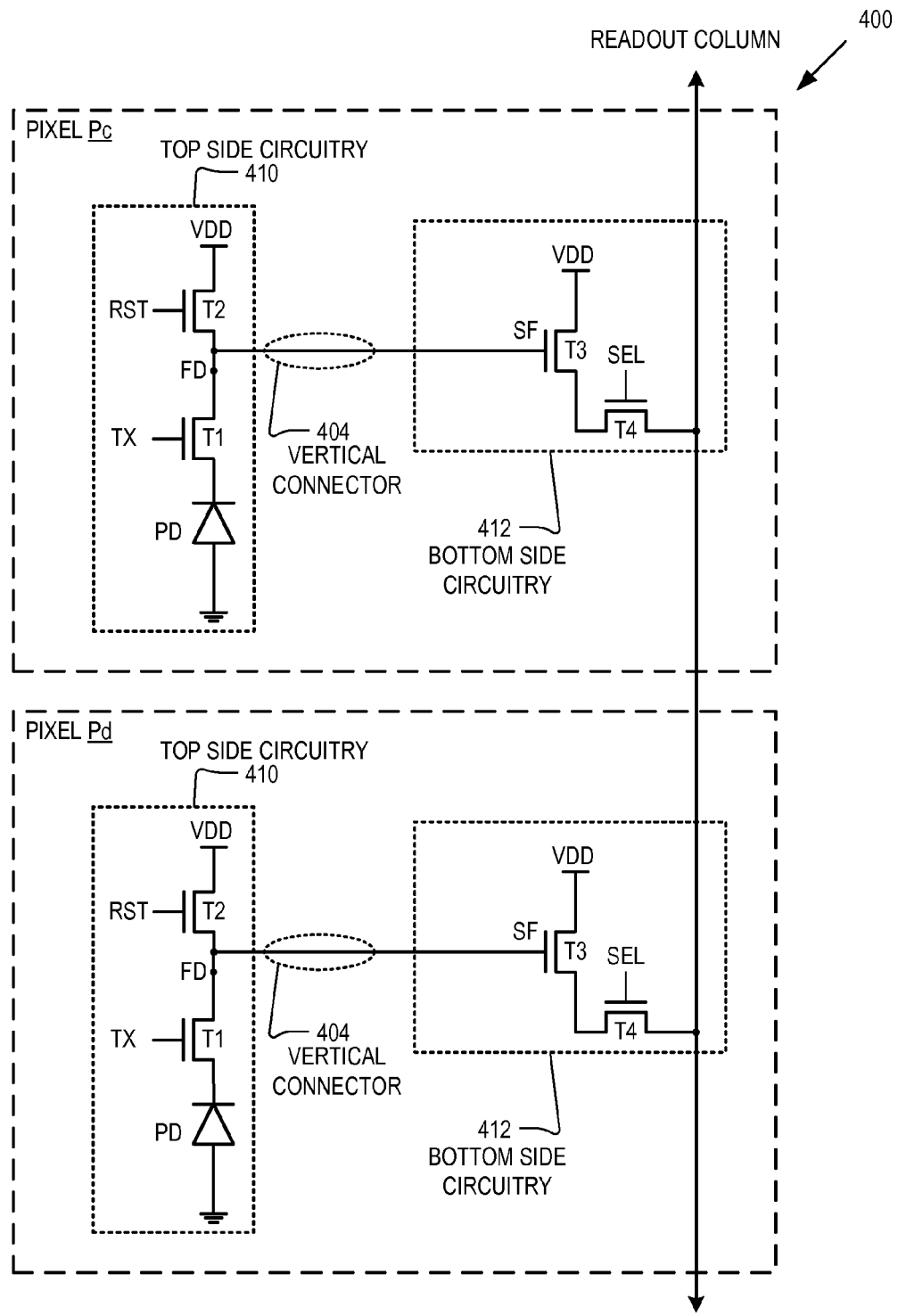
FIG. 4 is another circuit diagram illustrating pixel circuitry of two 4T pixels within an image sensor having a reset transistor disposed on a top-side of a semiconductor die, in accordance with an embodiment of the invention.

FIG. 4 is another circuit diagram illustrating pixel circuitry of two 4T pixels (i.e., Pixel Pc and Pixel Pd) within an image sensor having a reset transistor disposed on a top-side of a semiconductor die, in accordance with an embodiment of the invention. Pixel circuitry 400 is one possible pixel circuitry architecture for implementing each pixel within pixel array 105 of FIGS. 1A and 1B. Pixel circuitry 400 operates similarly to the pixel circuitry 200 of FIG. 2. That is, pixel circuitry 400 is also of the 4T pixel architecture. However, it should be appreciated that the embodiments of FIG. 4 are not limited to 4T pixel architectures; rather, one of ordinary skill in the art having the benefit of the instant disclosure will understand that the present teachings are also applicable to 3T designs, 5T designs, and various other pixel architectures.

In FIG. 4, pixels Pc and Pd are arranged in two rows and one column. As with pixel circuitry 200 of FIG. 2, the illustrated embodiment of each pixel in pixel circuitry 400 includes a photodetector (e.g., photodiode PD), a transfer (TX) transistor T1, a reset (RST) transistor T2, a source-follower (SF) transistor T3, a select (SEL) transistor T4, and a charge-to-voltage converter (e.g., floating diffusion node (FD)). However, as shown in FIG. 4, the photodiode PD, the transfer transistor T1, the floating diffusion node FD, and the reset transistor T2 are included in top side circuitry 410 and are thus disposed on a top-side of the semiconductor die, such as die 108 of FIGS. 1A and 1B. The source-follower transistor T3 and select transistor T4 are shown as being included in bottom-side circuitry 412 and are thus disposed on a bottom-side of the semiconductor die, such as die 108 of FIGS. 1A and 1B. The floating diffusion FD node is electrically coupled to the source-follower transistor T3 on the bottom-side of the semiconductor die by way of vertical connector 404. In other words, vertical connector 404 electrically couples top-side circuitry 410 to bottom-side circuitry 412. Vertical connector 404 may be any of the aforementioned vertical connectors, such as vertical connector 104 or vertical connector 106 of FIGS. 1A and 1B.

Figure 5:
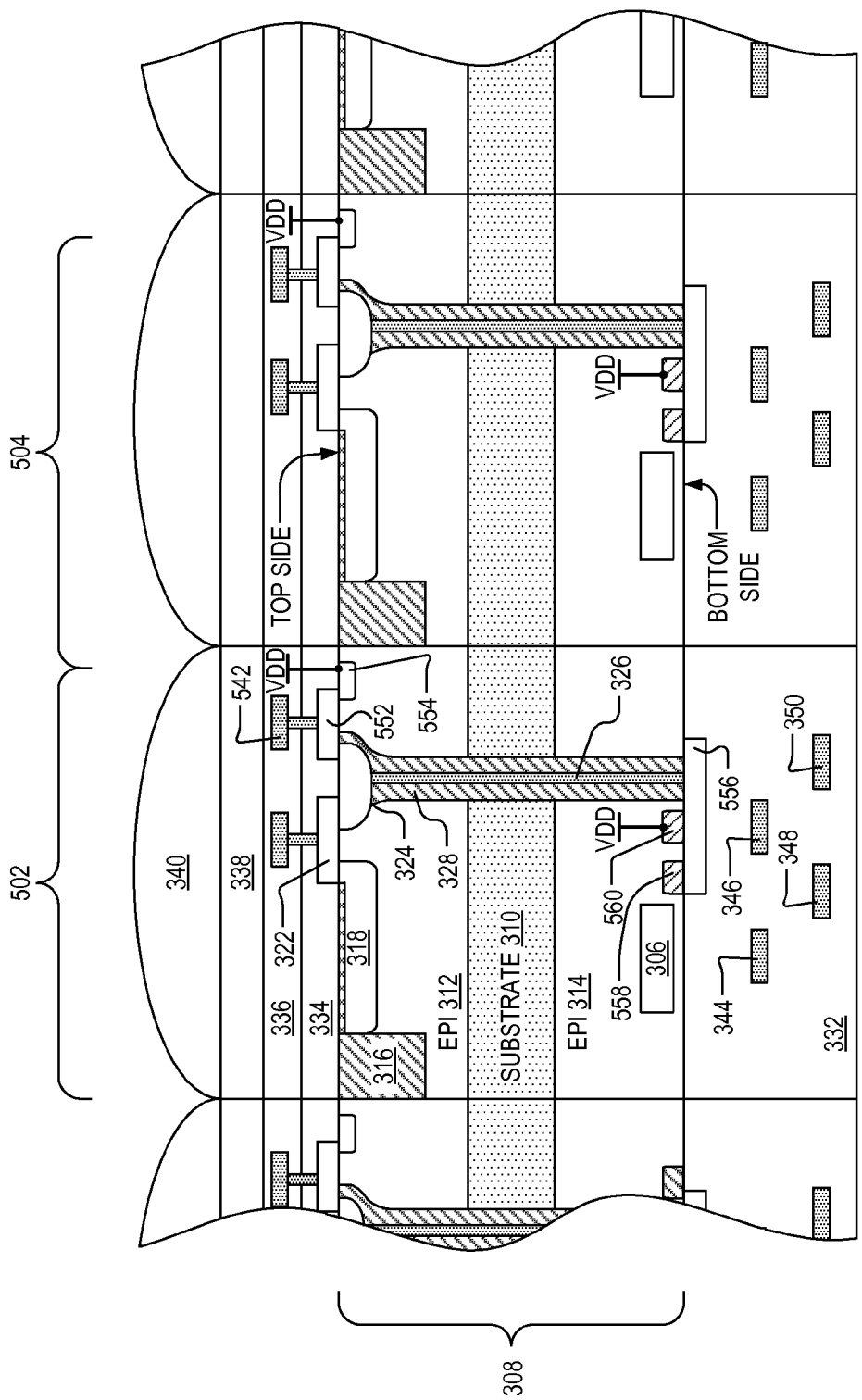
FIG. 5 is a cross sectional view of two pixels of an image sensor having a reset gate disposed on a top-side of a semiconductor die, in accordance with an embodiment of the invention.

FIG. 5 is a cross sectional view of two pixels 502 and 504 of an image sensor having a reset gate 552 disposed on a top-side of semiconductor die 308, in accordance with an embodiment of the invention. Pixels 502 and 504 are possible implementations of pixels Pc and Pd of FIG. 4, and of pixels 102 within pixel array 105 of FIGS. 1A and 1B. Pixels 502 and 504 operate substantially similar to pixels 302 and 304 of FIG. 3. However, pixels 502 and 504 include a reset transistor disposed on the top-side of semiconductor die 308. In addition, pixels 502 and 504 include a gate 556 of a source-follower transistor disposed on the bottom-side of semiconductor die 308 and coupled directly to vertical connector 326.

As shown in the embodiment of FIG. 5, pixel 502 includes a drain region 554 of a reset transistor disposed within epi layer 312 on the top-side of semiconductor die 308. Pixel 502 also includes a gate 552 of the reset transistor disposed on the top-side of semiconductor die 308 between floating diffusion region 324 and drain region 554. Reset gate 552 and drain region 554 form part of the reset transistor for resetting pixel 502, and represent one possible implementation of reset transistor T2 of FIG. 4. By placing the reset transistor T2 on the top side of semiconductor die 308, and electrically coupling it to floating diffusion 324 without going through the wafer, relatively less voltage is needed to reset the circuit. In contrast, the embodiments in FIGS. 2 and 3A show a reset transistor T2 on the bottom side of semiconductor die 308, which is electrically coupled to floating diffusion 324 on the top side by vertical connectors 204 and 326, respectively, through the wafer. The electrical coupling through the wafer, which may be up to 500 to 700 nm, produces more voltage drop, thereby requiring relatively more voltage to reset the circuit.

During operation, reset gate 552 receives a reset signal by way of metal layer 542 in top-side interconnect layer 336. Reset gate 552 then resets the pixel by coupling floating diffusion region to a predetermined voltage, such as voltage VDD. In one embodiment, the image sensor includes a reset gate driver (not shown) located in a periphery on the top-side of semiconductor die 308 and coupled to the reset gate 552 by way of metal layer 542 in top-side interconnect layer 336. In another embodiment, the reset gate driver is included in support circuitry 306 on the bottom-side of semiconductor die 308. In this embodiment, a reset gate driver included in support circuitry 306 is coupled to metal layer 346 of bottom-side interconnect layer 332, which is coupled to a second vertical connector (not shown), which is then coupled to provide the reset signal to the reset gate 552 by way of metal layer 542 of top-side interconnect layer 336. As mentioned above, additional vertical connectors utilized for transmitting additional signals between the top-side and bottom-side of semiconductor die 308, such as the aforementioned reset signal, may be located in a perimeter region of semiconductor die 308 and will be discussed in more detail below with reference to FIGS. 11 and 12.

As shown in FIG. 5, vertical connector 326 includes metal that extends from floating diffusion region 324 to a gate 556 of a source-follower transistor. The source-follower transistor includes gate 556, a drain region 560, and a source region 558. The source-follower transistor also includes a channel region (not shown) under gate 556 between source region 558 and drain region 560. Gate 556 is disposed on the bottom-side of semiconductor die 308 on bottom-side epi layer 314. Drain region 560 and source region 558 are disposed within bottom-side epi layer 314 and are coupled to gate 556. Gate 556, drain region 560, and source region 558 form part of the source-follower transistor for providing a high-impedance output from floating diffusion region 324, and represent one possible implementation of source-follower transistor T3 of FIG. 4. In one embodiment, drain region 560 is maintained at a predetermined voltage, such as voltage VDD.

Although FIG. 5 illustrates an embodiment of pixel 502 having photodiode region 318, transfer gate 322, and the reset transistor (i.e., reset gate 552 and drain region 554) all disposed on the top-side of semiconductor die 308 with the remainder of the pixel circuitry located in the support circuitry 306 on the bottom side, other embodiments may include more or even all of the pixel circuitry of pixel 502 disposed on the top-side of the semiconductor die 308. For example, in one embodiment, photodiode region 318, transfer gate 322, the reset transistor, the source-follower transistor, and the select transistor may all be located on the top-side of semiconductor die 308. In this embodiment, the output of the row select transistor may be coupled to a vertical connector to electrically connect with additional support circuitry, such as readout circuitry or function logic (e.g., see readout circuitry 110 and function logic 115 of FIG. 1B) located on the bottom side of semiconductor die 308.

Figure 6:
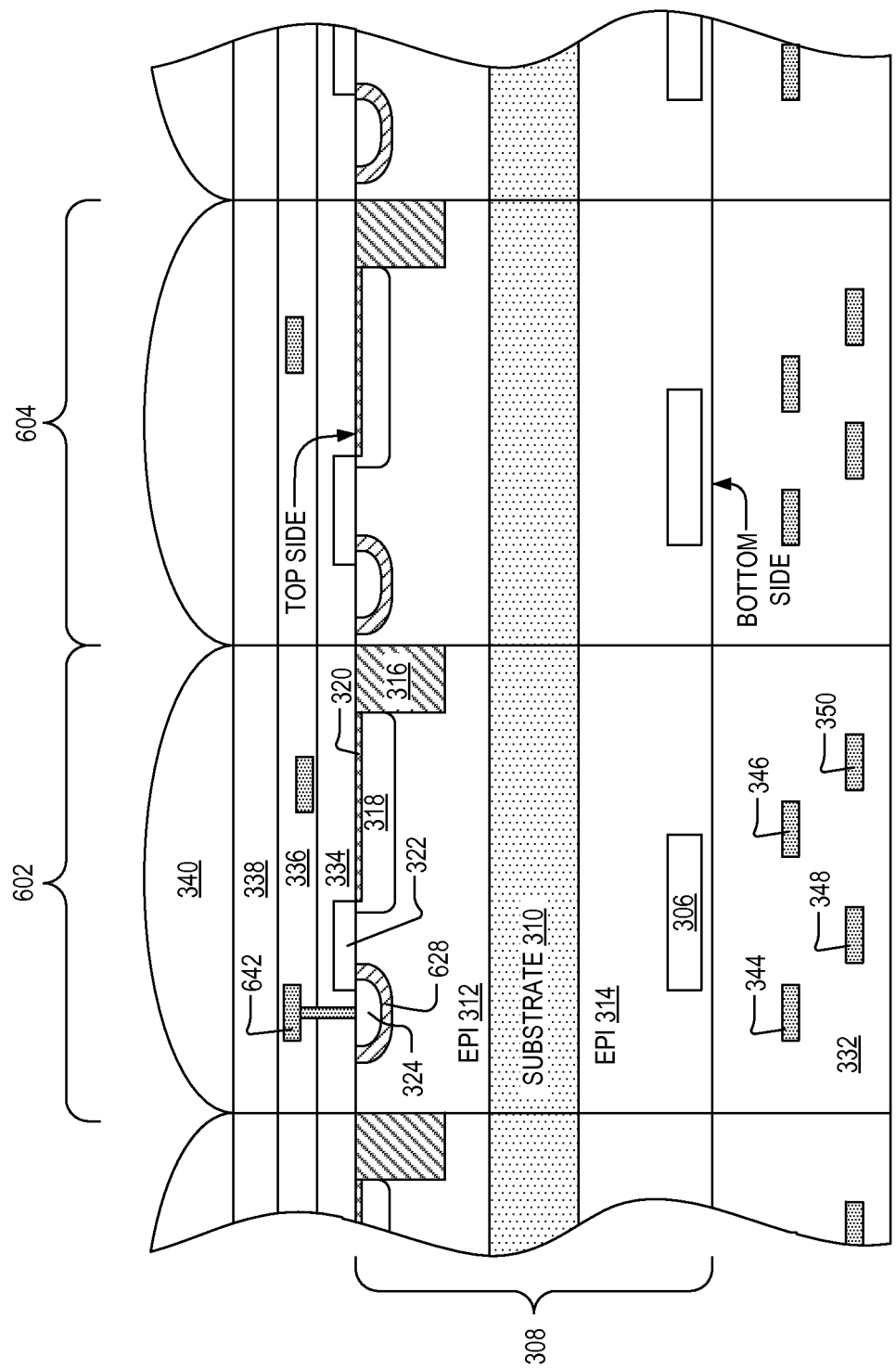
FIG. 6 is a cross sectional view of two pixels of an image sensor having support circuitry disposed on a bottom-side of a semiconductor die, in accordance with an embodiment of the invention.

FIG. 6 is a cross sectional view of two pixels 602 and 604 of an image sensor having support circuitry 306 disposed on a bottom-side of a semiconductor die 308, in accordance with an embodiment of the invention. Pixels 602 and 604 are possible implementations of pixels Pa and Pb of FIG. 2, of pixels Pc and Pd of FIG. 4, and of pixels 102 within pixel array 105 of FIGS. 1A and 1B. Pixels 602 and 604 operate substantially similar to pixels 302 and 304 of FIG. 3A. However, pixels 602 and 604 do not include a vertical connector within the pixels themselves. Instead, vertical connectors (not shown) are included outside of the pixel array in a perimeter region of semiconductor die 308, such as perimeter region 112 of FIG. 1A.

For example, pixel 602 includes floating diffusion region 324 that is surrounded laterally and on the bottom by junction isolation region 628, which is a doped well of a type that is opposite to floating diffusion 324. For example, floating diffusion 324 may be N+, whereas doped well 628 is P+. Also, transfer gate 322 is shown as disposed on the top-side of semiconductor die 308 between photodiode region 318 and floating diffusion 324. During operation, transfer gate 322 receives a transfer signal by way of interconnect layer 336. Transfer gate 322 then transfers the charge accumulated in photodiode region 318 to floating diffusion region 324. In one embodiment, floating diffusion region 324 is electrically coupled to additional pixel circuitry included in support circuitry 306 on the bottom-side of semiconductor die 308. For example, in the illustrated embodiment of FIG. 6 floating diffusion region 324 is coupled to metal layer 642 of top-side interconnect layer 336, which is coupled to a vertical connector (not shown) in a perimeter region of the semiconductor die, which is then coupled to metal layer 348 of bottom-side interconnect layer 332, and then to support circuitry 306 disposed within semiconductor die 308 at the bottom-side. Examples of vertical connectors located in a perimeter region of semiconductor die 308 will be discussed in more detail below with reference to FIGS. 11 and 12.

Figure 7:
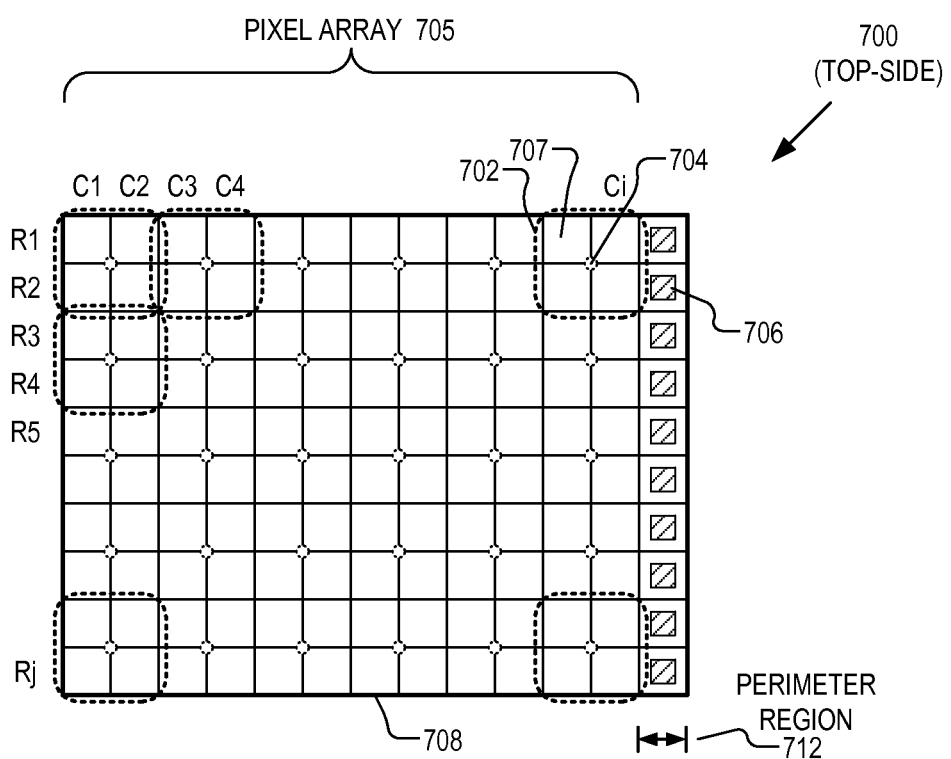
FIG. 7 is a top-side view of an image sensor having a pixel array arranged into pixel groups, where each group includes a shared vertical connection, in accordance with an embodiment of the invention.

FIG. 7 is a top-side view of an image sensor 700 having a pixel array 705 arranged into pixel groups (e.g., pixel group 702), where each group includes a shared vertical connection (e.g., vertical connector 704), in accordance with an embodiment of the invention. Pixel array 705 is a two-dimensional ("2D") array of pixels (e.g., pixel 707) formed on semiconductor die 708. In one embodiment, image sensor 700 is an active pixel sensor, where, for example, each pixel is a complementary metal-oxide-semiconductor ("CMOS") imaging pixel. As illustrated, each pixel is arranged into a row (e.g., rows R1 to Rj) and a column (e.g., column C1 to Ci) to acquire image data of a person, place, or object, which can then be used to render a 2D image of the person, place, or object. The pixels of pixel array 705 are also arranged into pixel groups (e.g., pixel group 702), where each pixel group shares at least one vertical connector (e.g., vertical connector 704). Although FIG. 7 illustrates each pixel group as including four pixels, other embodiments of pixel groups may each include, two, three, five, or more individual pixels.

Vertical connectors 704 and 706 are for electrically coupling circuitry formed on the top-side of semiconductor die 708 with support circuitry formed the bottom-side of semiconductor die 708. In the illustrated example vertical connectors 706 are formed along at least one edge of image sensor 700 in perimeter region 712. Although FIG. 7 illustrates only one column of vertical connectors 706 formed in perimeter region 712, other embodiments may include vertical connectors 706 on two or more perimeter regions of image sensor 700. Vertical connectors 704 are shown as being disposed within pixel array 705. In one embodiment, each pixel group 702 includes a corresponding vertical connector 704 within the pixel group (e.g., pixel group 702). However, in other embodiments, one or more of the vertical connectors 706 located in perimeter region 712 may be vertical connectors that are shared among a pixel group. Thus, although FIG. 7 illustrates image sensor 700 as including a combination of vertical connectors 704 disposed within the pixel groups 702, along with vertical connectors 706 disposed in perimeter region 712, other embodiments of image sensor 700 may include shared vertical connectors 704 within pixel group 702 without the inclusion of vertical connectors 706 in perimeter region 712. In yet another embodiment, image sensor 700 may include shared vertical connectors 706 in perimeter region 712 without the inclusion of vertical connectors 704 within each pixel group 702.

Figure 8:
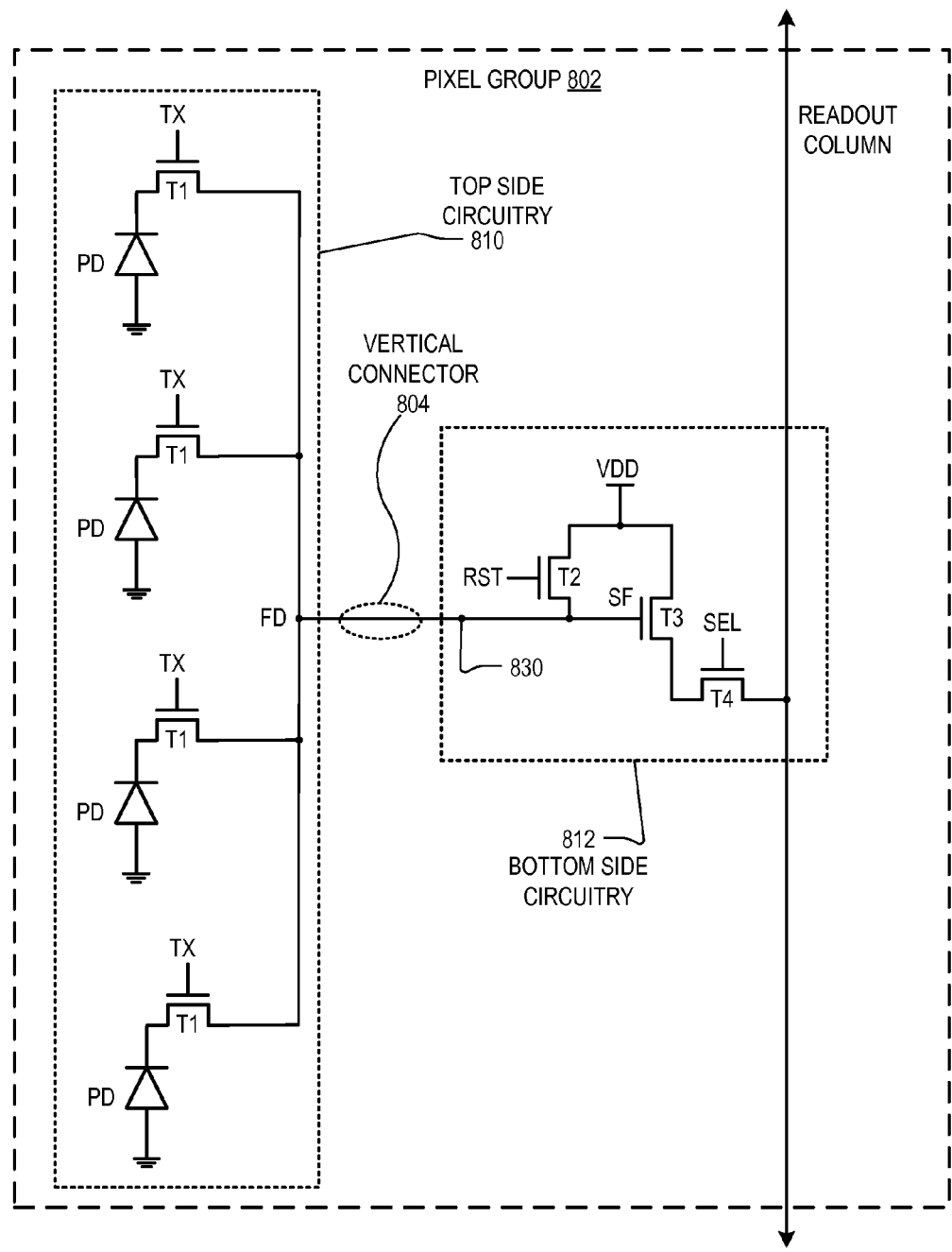
FIG. 8 is a circuit diagram illustrating pixel circuitry of a pixel group within an image sensor, in accordance with an embodiment of the invention.

FIG. 8 is a circuit diagram illustrating pixel circuitry of a pixel group 802 within an image sensor, in accordance with an embodiment of the invention. Pixel group 802 is one possible pixel circuitry architecture for implementing each pixel group within pixel array 705 of FIG. 7.

In the embodiment of FIG. 8, each pixel group 802 includes four adjacent pixels, where each pixel includes a photodetector (e.g., photodiode PD) and a transfer (TX) transistor T1. However, in this embodiment, the charge-to-voltage converter (e.g., floating diffusion node (FD)), the reset (RST) transistor T2, the source-follower (SF) transistor T3, and the select (SEL) transistor T4 are shared among pixels of the pixel group 802. For example, FIG. 8 illustrates the transfer transistor T1 of each pixel as being coupled to a single floating diffusion FD, where the floating diffusion FD is coupled to a single reset transistor T2 and a single source-follower transistor T3.

As shown in FIG. 8, the photodiodes PD, the transfer transistors T1 and the shared floating diffusion node FD are included in top-side circuitry 810 and are thus disposed on a top-side of the semiconductor die, such as die 708 of FIG. 7. The reset transistor T2, source-follower transistor T3, and select transistor T4 are shown as being included in bottom-side circuitry 812 and are thus disposed on a bottom-side of the semiconductor die, such as die 708 of FIG. 7.

During operation, transfer transistors T1 receive a transfer signals TX, which transfer the charge accumulated in photodiodes PD to the shared floating diffusion node FD. In one embodiment, floating diffusion node FD may be coupled to a storage capacitor (not shown) for temporarily storing image charges. The floating diffusion FD node is then electrically coupled to node 830 on the bottom-side of the semiconductor die by way of vertical connector 804. In other words, vertical connector 804 electrically couples top-side circuitry 810 to bottom-side circuitry 812. Vertical connector 804 may be any of the aforementioned vertical connectors, such as vertical connector 704 or vertical connector 706 of FIG. 7. Alternatively, the electrical coupling between top-side circuitry 810 to bottom-side circuitry 812 may be achieved with a floating diffusion that extends from the top side through the wafer to the bottom side, such as extended floating diffusion 324b of FIG. 3B. In one embodiment, the TX signals, the RST signal, and the SEL signal are generated by control circuitry, such as control circuitry 120 of FIG. 1B.

In one embodiment, the sharing of the floating diffusion node FD among multiple pixels in pixel group 802 allows for multiple ways of pixel binning. For example, several color pixel signals can be binned together by way of shared floating diffusion node FD to produce a panchromatic signal. Similarly, several pixels of the same color could be binned together to produce a higher sensitivity output at lower spatial resolution. In one embodiment, spatial resolution is sacrificed for one color of the pixel array, but not for others. That is, in this example, four red pixels may be binned together, while individual pixels are preserved for the green and blue colors. In yet another example, pixels of a variety of colors are binned together to produce a high sensitivity, low spatial resolution panchromatic signal. For example, a three-by-three pixel group may include two red pixels, 4 green pixels, and 2 blue pixels, where the middle pixel position is a common floating diffusion.

Figure 9A:
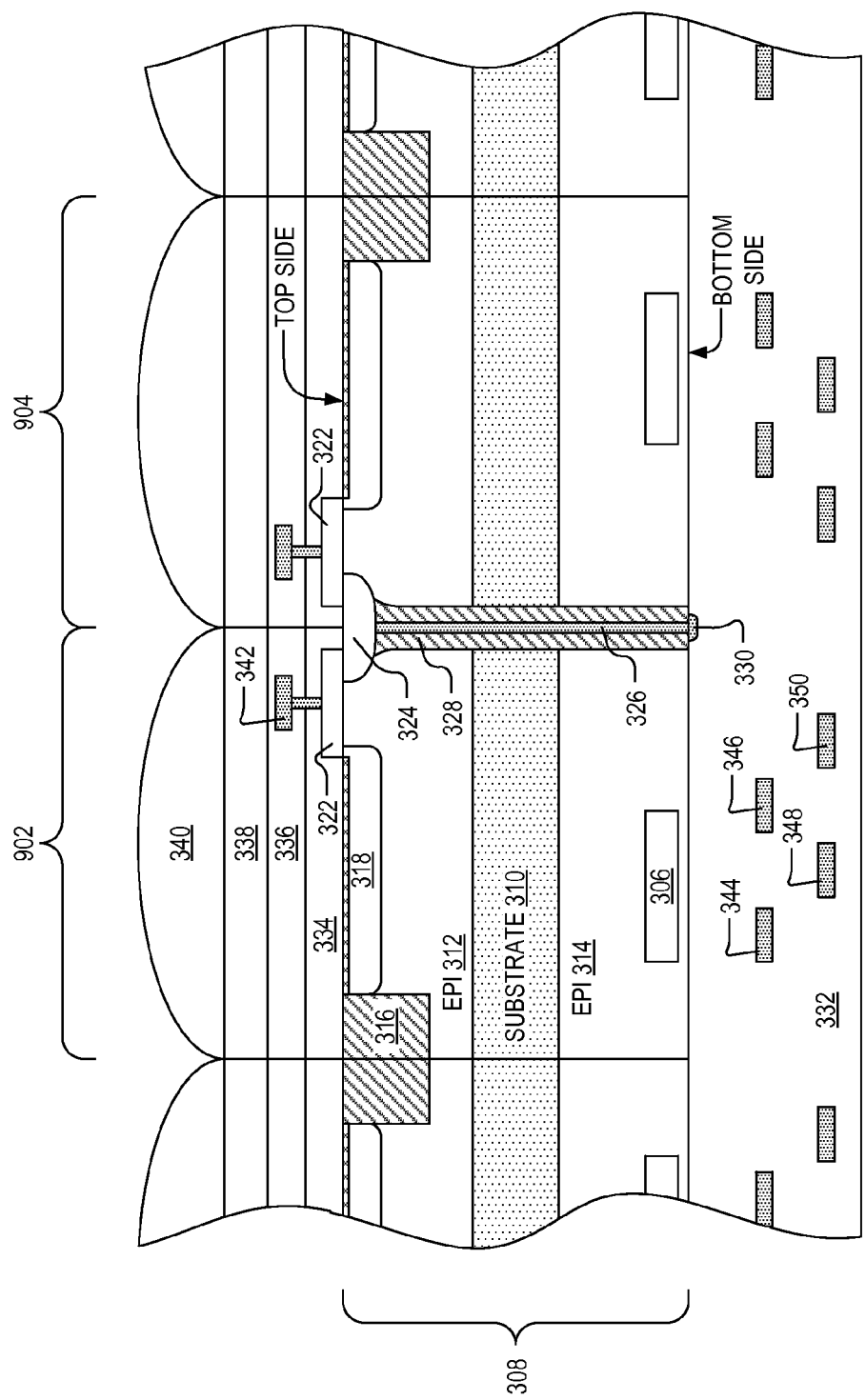
FIG. 9A is a cross-sectional view of two pixels of an image sensor having a shared charge-to-voltage converter and a shared vertical connection, in accordance with an embodiment of the invention.

FIG. 9A is a cross-sectional view of two pixels 902 and 904 of an image sensor having a shared charge-to-voltage converter (e.g., floating diffusion region 324) and a shared vertical connection (e.g., vertical connector 326), in accordance with an embodiment of the invention. Pixels 902 and 904 are possible implementations of two pixels of pixel group 702 of FIG. 7, and of two pixels of pixel group 802 of FIG. 8. Pixels 902 and 904 operate substantially similar to pixels 302 and 304 of FIG. 3A. However, pixels 902 and 904 share floating diffusion region 324 and vertical connector 326.

As shown in the embodiment of FIG. 9A, transfer gate 322 of pixel 902 and transfer gate 322 of pixel 904 are both coupled to floating diffusion region 324. During operation, transfer gates 322 receive a transfer signal by way of metal layer 342 in top-side interconnect layer 336. Transfer gates 322 then transfer the charge accumulated in their respective photodiode regions 318 to floating diffusion region 324. In one embodiment, vertical connector 326 includes metal that extends from floating diffusion region 324 to node 330 located on the bottom-side of semiconductor die 308. By way of reference, node 330 may correspond with node 830 in pixel group 802 of FIG. 8.

Figure 9B:
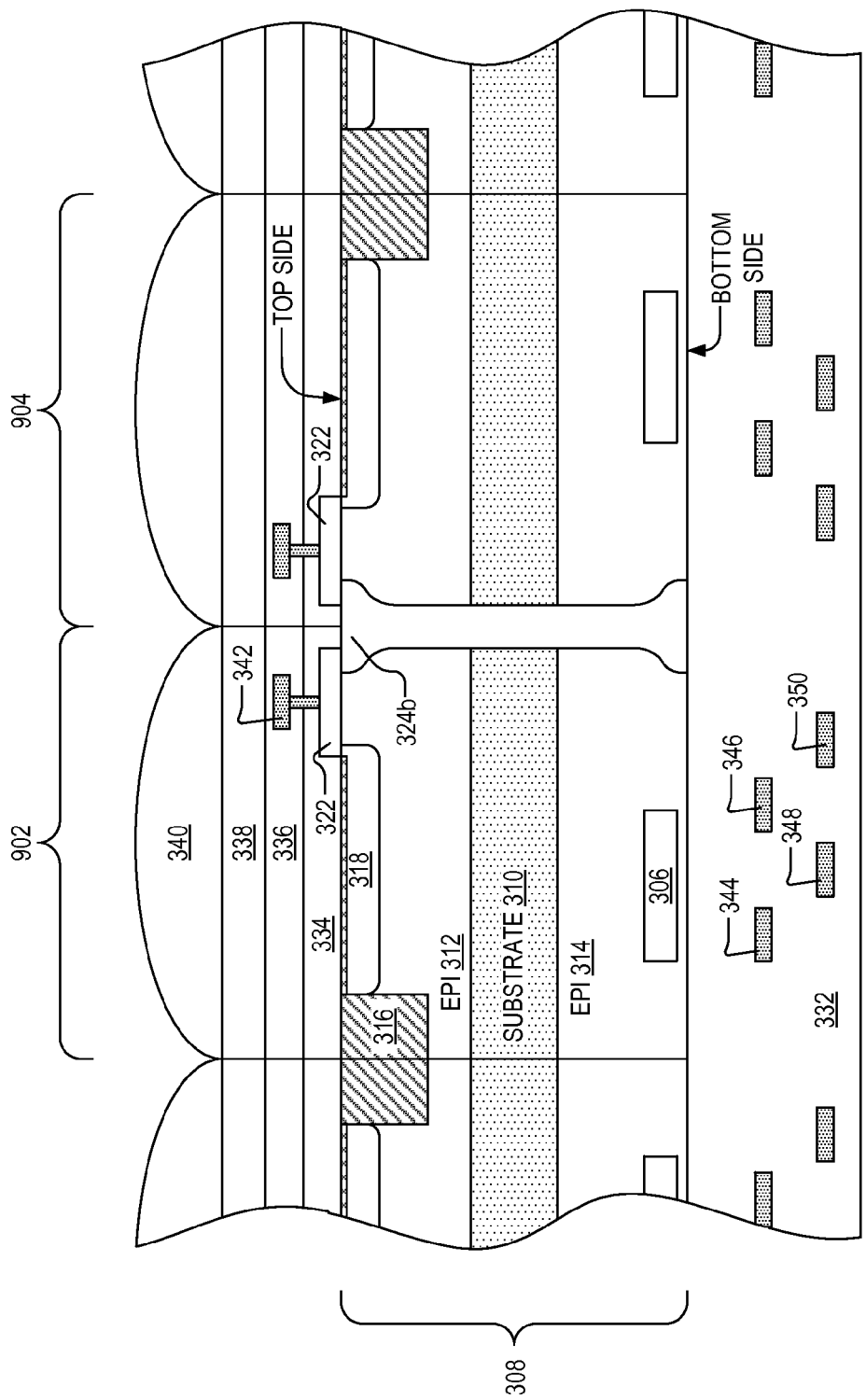
FIG. 9B is a cross-sectional view of two pixels of an image sensor having an extended and shared charge-to-voltage converter, in accordance with an embodiment of the invention.

An alternative embodiment to floating diffusion 324, vertical connector 328 and node 330 as shown in FIG. 9A is an extended floating diffusion 324b as shown in FIG. 9B. Extended floating diffusion 324b, which spans through semiconductor die 308, may be N+, and may additionally be surrounded by a P+ layer (not shown). Extended floating diffusion 324b is connected to transfer gates 322 of pixels 902 and 904 at the top side, and is electrically coupled to support circuitry 306 at the bottom side. Examples of electrical coupling between extended floating diffusion 324b and support circuitry 306 are similar to examples involving vertical connector 326 in the preceding paragraphs.

Figure 10:
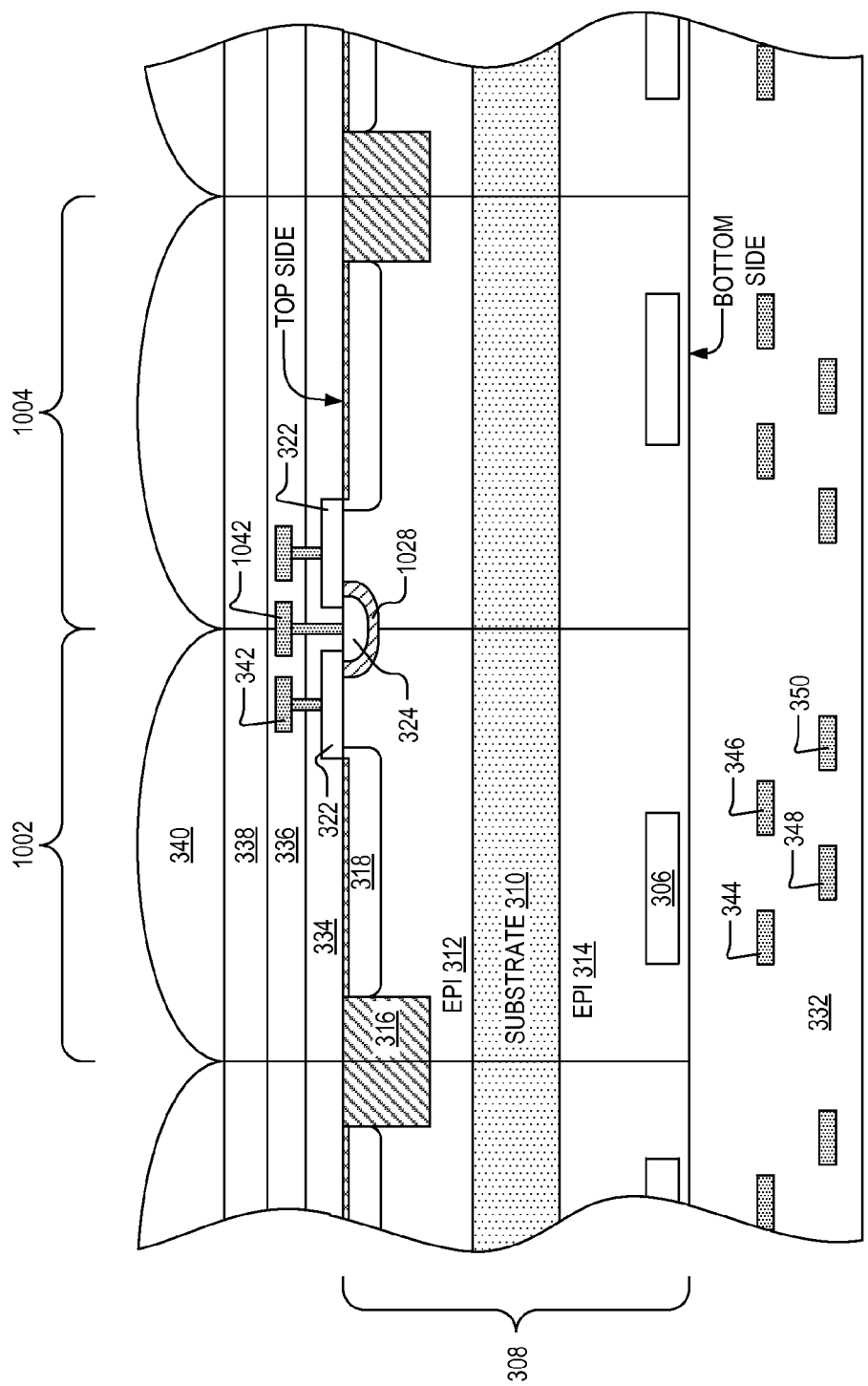
FIG. 10 is a cross-sectional view of two pixels of an image sensor having a shared charge-to-voltage converter, in accordance with an embodiment of the invention.

FIG. 10 is a cross-sectional view of two pixels 1002 and 1004 of an image sensor having a shared charge-to-voltage converter (e.g., floating diffusion region 324), in accordance with an embodiment of the invention. Pixels 1002 and 1004 are possible implementations of two pixels of pixel group 702 of FIG. 7, and of two pixels of pixel group 802 of FIG. 8. Pixels 1002 and 1004 operate substantially similar to pixels 902 and 904 of FIG. 9. However, the pixel group of pixels 1002 and 1004 do not include a vertical connector within the pixel group. Instead, vertical connectors (not shown) are included outside of the pixel array in a perimeter region of semiconductor die 308, such as perimeter region 712 of FIG. 7.

As shown in the embodiment of FIG. 10, transfer gate 322 of pixel 1002 and transfer gate 322 of pixel 1004 are both disposed on the top-side of semiconductor die 308 and both are coupled to floating diffusion region 324. During operation, transfer gates 322 receive a transfer signal by way of metal layer 342 in top-side interconnect layer 336. Transfer gates 322 then transfer the charge accumulated in their respective photodiode regions 318 to floating diffusion region 324.

In the illustrated example of FIG. 10, shared floating diffusion region 324 is surrounded laterally and on the bottom by junction isolation region 1028, which is a well of a type that is opposite to floating diffusion 324. For example, floating diffusion may be N+, whereas doped well 1028 may be P+. In one embodiment, floating diffusion region 324 is electrically coupled to additional pixel circuitry included in support circuitry 306 on the bottom-side of semiconductor die 308. For example, in the illustrated embodiment of FIG. 10 floating diffusion region 324 is coupled to metal layer 1042 of top-side interconnect layer 336, which is coupled to a vertical connector (not shown) in a perimeter region of the semiconductor die 308, which is then coupled to metal layer 348 of bottom-side interconnect layer 332, and then to support circuitry 306 disposed within semiconductor die 308 at the bottom-side. Examples of vertical connectors located in a perimeter region of semiconductor die 308 will be discussed in more detail below with reference to FIGS. 11 and 12.

Figure 11:
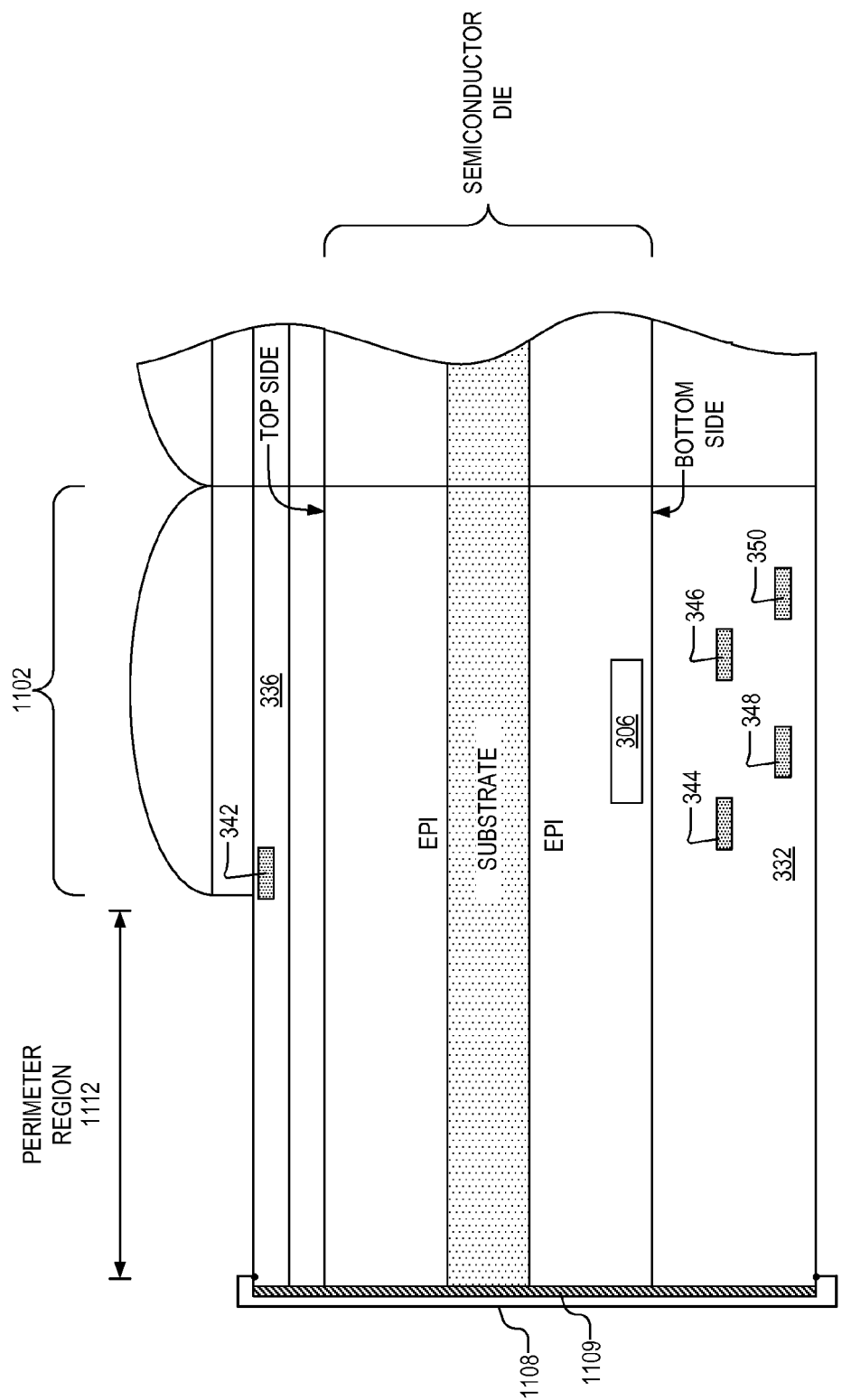
FIG. 11 is a cross-sectional view of a perimeter region of an image sensor having a vertical connector implemented as wire routing, in accordance with an embodiment of the invention.

FIG. 11 is a cross-sectional view of a perimeter region 1112 of an image sensor having a vertical connector implemented as wire routing 1108, in accordance with an embodiment of the invention. Pixel 1102 may be any of the previously mentioned pixels including, pixel 102 of FIG. 1A, pixel Pa of FIG. 2, pixels 302 of FIGS. 3A and 3B, pixel Pc of FIG. 4, pixel 502 of FIG. 5, pixel 602 of FIG. 6, pixel 702 of FIG. 7, pixels 902 of FIGS. 9A and 9B, and pixel 1002 of FIG. 10. Perimeter region 1112 may correspond with perimeter region 112 of FIG. 1A or with perimeter region 712 of FIG. 7.

As shown in FIG. 11, wire routing 1108 is positioned at the perimeter region 1112 of the semiconductor die, and electrically connects top-side interconnect layer 336 with bottom-side interconnect layer 332. In one embodiment, wire routing 1108 is a wire or wires, which may be insulated, that are coupled to a metal layer of top-side interconnect layer 336 and are routed around the side-edge of the semiconductor die, and then are coupled to a metal layer of the bottom-side interconnect layers 332. In another embodiment, wire routing 1108 is a metal trace or traces that are formed on the side-edge of the semiconductor die, and are similarly coupled to the top side and the bottom side as the previous embodiment. Further, wire routing 1108 may be insulated from the side-edge of the semiconductor die by insulator 1109, which may be a dielectric, such as silicon oxide.

Vertical connectors located in the perimeter region 1112, such as wire routing 1108, may be utilized for transmitting signals between the top-side and bottom-side of the semiconductor die. For example, one or more of the signals for controlling the pixel circuitry, such as the transfer signal, the reset signal, and the select signal, may be transferred from support circuitry 306 on the bottom side to the top-side circuitry by way of one or more wire routings 1108. In addition, as mentioned previously, the floating diffusion region of pixel 1102 at the top-side may be coupled to a source-follower transistor at the bottom-side by way of wire routing 1108.

Figure 12:
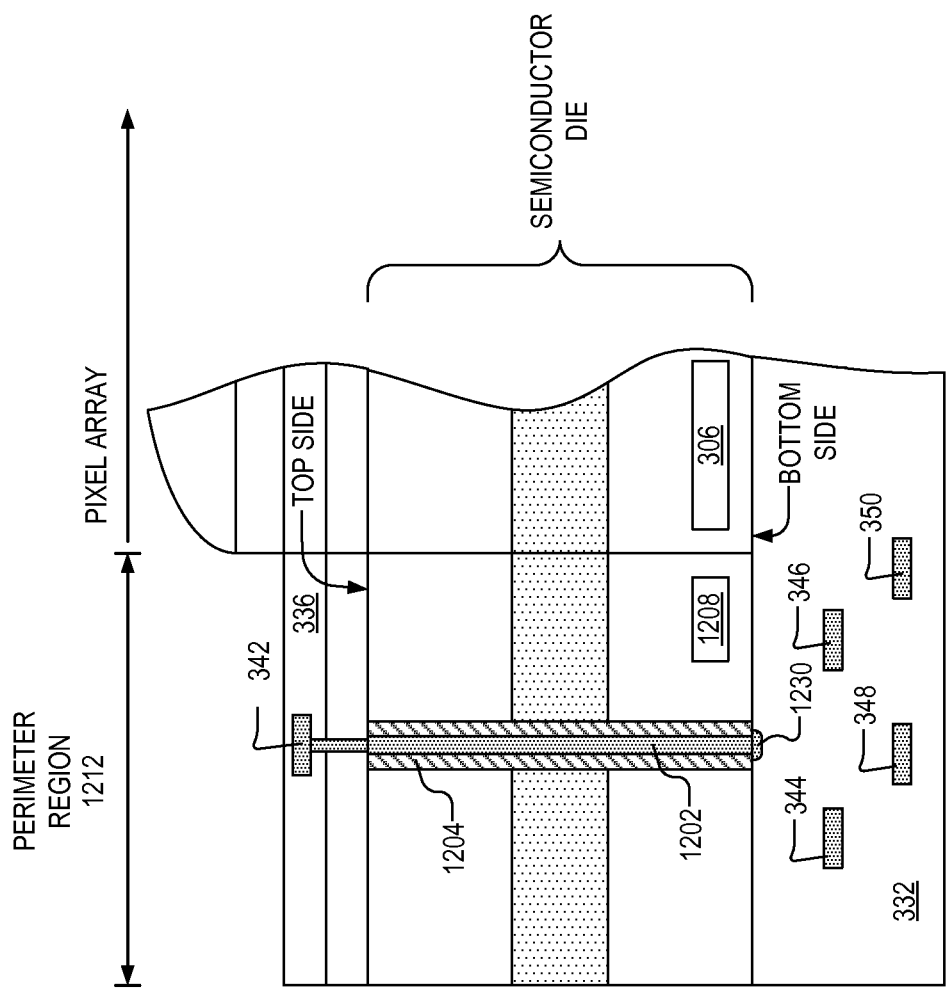
FIG. 12 is a cross-sectional view of a perimeter region of an image sensor having a vertical connector implemented as a through silicon via (TSV), in accordance with an embodiment of the invention.

FIG. 12 is a cross-sectional view of a perimeter region 1212 of an image sensor having a vertical connector implemented as a through silicon via (TSV) 1202, in accordance with an embodiment of the invention. The illustrated pixel array includes pixels adjacent to perimeter region 1212 and may be any of the previously mentioned pixels including, pixel 102 of FIG. 1A, pixel Pa of FIG. 2, pixels 302 of FIGS. 3A and 3B, pixel Pc of FIG. 4, pixel 502 of FIG. 5, pixel 602 of FIG. 6, pixel 702 of FIG. 7, pixels 902 of FIGS. 9A and 9B, and pixel 1002 of FIG. 10. Perimeter region 1212 may correspond with perimeter region 112 of FIG. 1A or with perimeter region 712 of FIG. 7.

As shown in FIG. 12, TSV 1202 is positioned at the perimeter region 1212 of the semiconductor die, and electrically connects top-side interconnect layer 336 with bottom-side interconnect layers 332. In one embodiment, TSV 1202 includes metal that extends from the top-side to the bottom-side of the semiconductor die and is laterally surrounded by isolation region 1204. Bottom-side interconnect layers 332 may further include node 1230 coupled to TSV 1202 at the bottom-side. In an alternative embodiment, interconnect layers 332 do not include node 1230, and TSV 1202 is coupled directly with at least one of the metal layers 344, 346, 348, or 350.

TSV 1202 may be utilized for transmitting signals between the top-side and bottom-side of the semiconductor die. For example, one or more of the signals for controlling the pixel circuitry, such as the transfer signal, the reset signal, and the select signal, may be transferred from support circuitry 306 on the bottom side to the top-side circuitry by way of one or more TSVs 1202. In one embodiment, a driver circuit 1208 is included in the perimeter region 1212 at the bottom-side of the semiconductor die for driving one or more of the pixel transistors located at the top-side. Thus, in this embodiment, driver circuit 1208 may generate a transfer signal output onto metal layer 344, which is coupled to node 1230, which is coupled to TSV 1202, which is coupled to metal layer 342 for outputting to a transfer gate of a pixel located on the top-side of the semiconductor die. In addition, as mentioned previously, a floating diffusion region of a pixel at the top-side may be coupled to a source-follower transistor at the bottom-side by way of TSV 1202.

Figure 13:
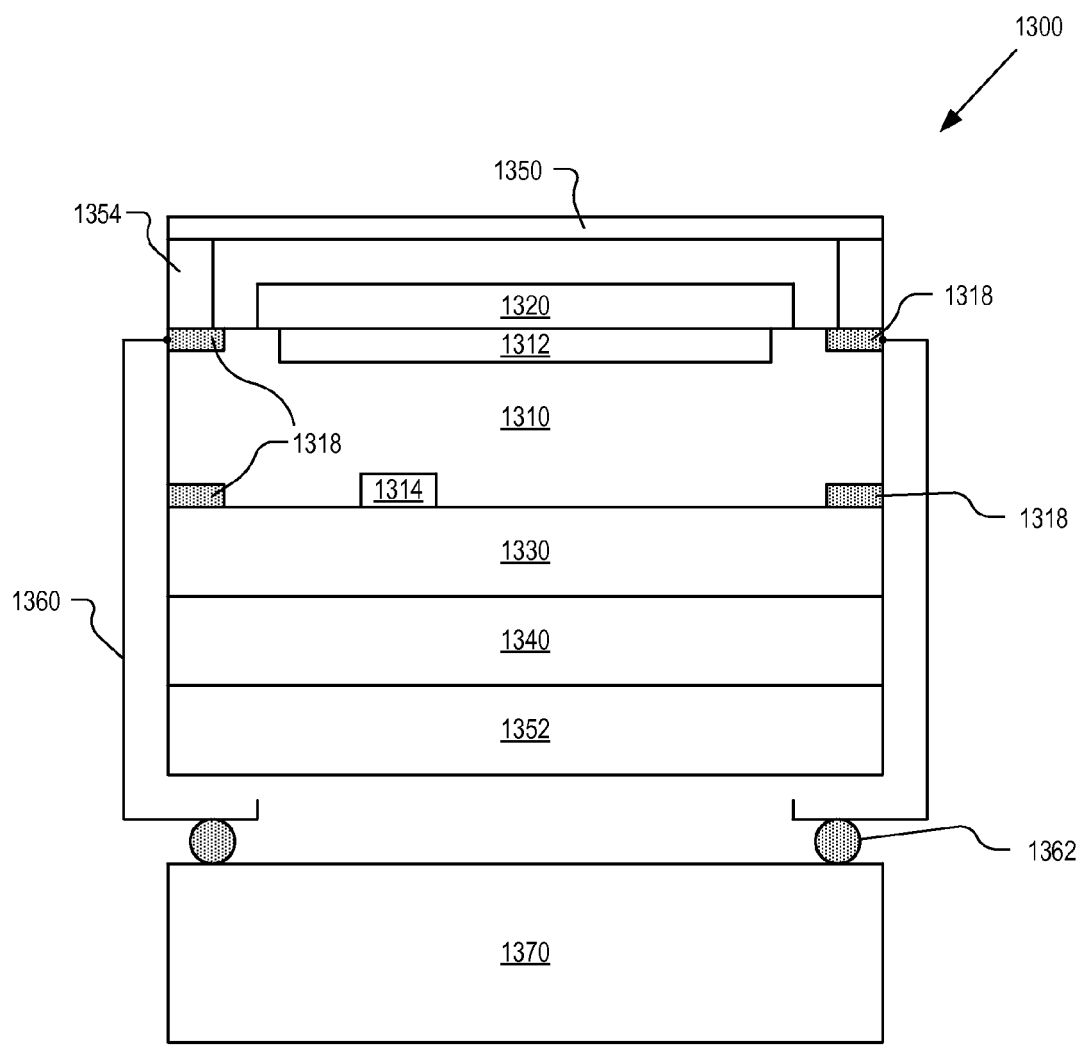
FIG. 13 is a cross-sectional view of an image sensor package, in accordance with an embodiment of the invention.

FIG. 13 is a cross-sectional view of an image sensor package, in accordance with an embodiment of the invention. The illustrated embodiment of image sensor package 1300 includes a semiconductor die 1310, color filter and microlens assembly 1320, bonding oxide 1330, silicon carrier 1340, top glass 1350, bottom glass 1352, perimeter wire routing 1360 and controller 1370.

Semiconductor die 1310 includes at its top-side sensing elements 1312, which may include photodetector, transfer gate and charge-to-voltage conversion mechanism, as disclosed herein. The top-side of sensing elements 1312 may additionally include part or all of readout circuitry such as reset transistor, source follower and row select transistor. Semiconductor die 1310 includes at its bottom-side process logic 1314, which may include row and column decoders and drivers, per column sample and hold circuits, analog signal processing chains, digital imaging processing blocks, memory, timing and control circuits, input/output (I/O), and bond pads. The bottom side of semiconductor die may additionally include support circuitry, which may include part or all of the readout circuitry.

Color filter and microlens assembly 1320 is positioned atop sensing elements 1312. Top glass 1350 is positioned atop of color filter and microlens assembly 1350, and rests upon DAM 1354 as shown, in an embodiment in accordance with the invention. The bottom-side of semiconductor die 1310 is bonded to silicon carrier 1340 by bonding oxide 1330. Bottom glass 1352 is attached to silicon carrier 1340 as shown, in an embodiment in accordance with the invention. In alternative embodiments (not shown), the bottom side of semiconductor die 1310 is either bonded to silicon carrier 1340 by bonding oxide 1330, or is directly bonded to bottom glass 1352. In other words, in these alternative embodiments (not shown), either bonding oxide 1330 and silicon carrier are present, or bottom glass 1352 is present, but not both.

Semiconductor die 1310 includes, at its top-side and bottom-side, and around its perimeter, perimeter connectors 1318 as shown, in an embodiment in accordance with the invention. Perimeter wire routing 1360 is situated at the perimeter of the stack, and is connected to perimeter connectors 1318 as shown. Examples of perimeter wire routing 1360 include insulated wires, and metal traces formed on the side-edge of semiconductor die 1310, wherein the metal traces are insulated from the side-edge of semiconductor die 1310 by an insulator (not shown). By way of reference, examples of perimeter wire routing 1360 may correspond with wire routing 1108 of FIG. 11. Perimeter wire routing 1360 provides electrical connection between the top side and the bottom side of semiconductor die 1310, as well as electrical connection between semiconductor die 1310 and other elements of imager 1300. For example, as shown in FIG. 13, perimeter wire routing 1360 is electrically connected to controller 1370 with solder balls 1362. Controller 1370 exercises control over semiconductor die 1310, and processes data received from semiconductor die 1310.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor, comprising:
   a single semiconductor wafer die having a first side and a second side that is opposite the first side;
   a photodetector of a pixel disposed within the single semiconductor wafer die on the first side for accumulating an image charge in response to light incident on the first side of the single semiconductor wafer die;
   a charge-to-voltage converter of the pixel disposed within the single semiconductor wafer die on the first side;
   a transfer gate of the pixel disposed on the first side of the single semiconductor wafer die between the photodetector and the charge-to-voltage converter to transfer the image charge from the photodetector to the charge-to-voltage converter; and
   support circuitry disposed within the single semiconductor wafer die on the second side and electrically coupled to the charge-to-voltage converter.

2. The image sensor of claim 1, wherein the charge-to-voltage converter extends from the first side to the second side through the single semiconductor wafer die.

3. The image sensor of claim 1, further comprising a vertical connector coupled to the charge-to-voltage converter to electrically couple the charge-to-voltage converter to the support circuitry on the second side of the single semiconductor wafer die.

4. The image sensor of claim 3, wherein the vertical connector is disposed within the single semiconductor wafer die and extends from the charge-to-voltage converter to the second side of the single semiconductor wafer die.

5. The image sensor of claim 3, wherein the vertical connector is disposed in a perimeter region of the single semiconductor wafer die, the image sensor further comprising an interconnect layer disposed on the first side of the single semiconductor wafer die to electrically couple the charge-to-voltage converter to the vertical connector.

6. The image sensor of claim 5, wherein the vertical connector is disposed within the single semiconductor wafer die and extends from the first side to the second side of the single semiconductor wafer die.

7. The image sensor of claim 5, wherein the vertical connector comprises a wire routing from the first side, around a side edge of the single semiconductor wafer die to the second side.

8. The image sensor of claim 3, wherein the vertical connector comprises a through silicon via (TSV).

9. The image sensor of claim 1, wherein the support circuitry comprises a source-follower transistor having a gate disposed on the second side of the single semiconductor wafer die, wherein the gate of the source-follower transistor is electrically coupled to the charge-to-voltage converter to provide a high impedance output from the charge-to-voltage converter.

10. The image sensor of claim 1, further comprising:
    a driver circuit disposed within the single semiconductor wafer die on the second side; and
    a vertical connector disposed to electrically couple the transfer gate on the first side with the driver circuit on the second side of the single semiconductor wafer die.

11. The image sensor of claim 1, further comprising an interconnect layer disposed on the second side of the single semiconductor wafer die for electrically coupling the charge-to-voltage converter to the support circuitry on the second side.

12. The image sensor of claim 1, wherein the support circuitry comprises one or more pixel circuitry transistors of the pixel selected from the group consisting of a reset transistor coupled to reset the pixel, a source follower transistor coupled to provide a high impedance output from the charge-to-voltage converter, and a select transistor coupled to select the pixel from other pixels of the image sensor for readout.

13. The image sensor of claim 1, wherein the support circuitry comprises one or more circuits selected from the group consisting of a row decoder, a column decoder, a row driver, a column driver, a column sample and hold circuit, an analog signal processing chain, a digital imaging processing block, memory, a timing and control circuit, an input/output (I/O) circuit, and a bonding pad.

14. The image sensor of claim 1, further comprising:
    a drain region of a reset transistor of the pixel, the drain region disposed within the single semiconductor wafer die on the first side; and
    a gate of the reset transistor disposed on the first side of the single semiconductor wafer die between the charge-to-voltage converter and the drain region of the reset transistor, wherein the reset transistor is coupled to reset the pixel.

15. The image sensor of claim 1, wherein the single semiconductor wafer die comprises:
    a substrate;
    a first epitaxial (epi) layer disposed on the substrate to provide the first side of the single semiconductor wafer die, wherein the photodetector and charge-to-voltage converter are disposed within the first epi layer; and
    a second epi layer disposed on a surface of the substrate opposite the first epi layer, the second epi layer to provide the second side of the single semiconductor wafer die, wherein the support circuitry is disposed within the second epi layer.

16. The image sensor of claim 1, wherein the pixel is a first pixel of an array of pixels included in the image sensor, the image sensor further comprising a second pixel of the array of pixels disposed on the first side of the single semiconductor wafer die adjacent to the first pixel, wherein the charge-to-voltage converter is a shared charge-to-voltage converter coupled to the transfer gate of the first pixel and to a transfer gate of the second pixel.

17. A complementary metal-oxide semiconductor ("CMOS") image sensor, comprising:
a single semiconductor wafer die having a first side and a second side that is opposite the first side;
an array of pixels arranged into a plurality of rows and columns, wherein each pixel includes:
a photodetector disposed within the single semiconductor wafer die on the first side for accumulating an image charge in response to light incident on the first side of the single semiconductor wafer die;
a charge-to-voltage converter disposed within the single semiconductor wafer die on the first side;
a transfer gate disposed on the first side of the single semiconductor wafer die between the photodetector and the charge-to-voltage converter to transfer the image charge from the photodetector to the charge-to-voltage converter; and
support circuitry disposed within the single semiconductor wafer die on the second side and electrically coupled to the charge-to-voltage converter.

18. The image sensor of claim 17, wherein the charge-to-voltage converter extends from the first side to the second side through the single semiconductor wafer die.

19. The image sensor of claim 17, further comprising at least one vertical connector coupled to the charge-to-voltage converter to electrically couple the charge-to voltage converter to the support circuitry on the second side of the single semiconductor wafer die.

20. The image sensor of claim 19, wherein the vertical connector of each pixel is disposed within the single semiconductor wafer die and extends from the charge-to-voltage converter to the second side of the single semiconductor wafer die.

21. The image sensor of claim 19, wherein the vertical connector of each pixel is disposed in a perimeter region of the single semiconductor wafer die, the image sensor further comprising an interconnect layer disposed on the first side of the single semiconductor wafer die to electrically couple the charge-to-voltage converter to the vertical connector.

22. The image sensor of claim 21, wherein the vertical connector is disposed within the single semiconductor wafer die and extends from the first side to the second side of the single semiconductor wafer die.

23. The image sensor of claim 21, wherein the vertical connector comprises a wire routing from the first side, around a side edge of the single semiconductor wafer die to the second side.

24. The image sensor of claim 19, wherein the vertical connector comprises a through silicon via (TSV).

25. The image sensor of claim 17, wherein the support circuitry comprises one or more pixel circuitry transistors of the pixel selected from the group consisting of a reset transistor coupled to reset the pixel, a source follower transistor coupled to provide a high impedance output from the charge-to-voltage converter, and a select transistor coupled to select the pixel from other pixels of the image sensor for readout.

26. The image sensor of claim 17, wherein the support circuitry comprises a source-follower transistor having a gate disposed on the second side of the single semiconductor wafer die, wherein the gate of the source-follower transistor is electrically coupled to the charge-to-voltage converter to provide a high impedance output from the charge-to-voltage converter.

27. The image sensor of claim 17, further comprising an interconnect layer disposed on the second side of the single semiconductor wafer die for electrically coupling the charge-to-voltage converter to the support circuitry on the second side.

28. The image sensor of claim 17, wherein the support circuitry comprises one or more circuits selected from the group consisting of a row decoder, a column decoder, a row driver, a column driver, a column sample and hold circuit, an analog signal processing chain, a digital imaging processing block, memory, a timing and control circuit, an input/output (I/O) circuit, and a bonding pad.

29. The image sensor of claim 17, wherein each pixel further comprises:
a drain region of a reset transistor, the drain region disposed within the single semiconductor wafer die on the first side; and
a gate of the reset transistor disposed on the first side of the single semiconductor wafer die between the charge-to-voltage converter and the drain region of the reset transistor, wherein the reset transistor is coupled to reset the pixel.

30. The image sensor of claim 17, wherein the single semiconductor wafer die comprises:
a substrate;
a first epitaxial (epi) layer disposed on the substrate to provide the first side of the single semiconductor wafer die, wherein the photodetector and charge-to-voltage converter of each pixel are disposed within the first epi layer; and
a second epi layer disposed on a surface of the substrate opposite the first epi layer, the second epi layer to provide the second side of the single semiconductor wafer die, wherein the support circuitry of each pixel is disposed within the second epi layer.

* * * * *